(12) United States Patent
Hanawa

(10) Patent No.: US 8,362,694 B2
(45) Date of Patent: Jan. 29, 2013

(54) ORGANIC LIGHT EMITTING DEVICE, METHOD OF MANUFACTURING THE SAME, DISPLAY UNIT, AND ELECTRONIC DEVICE

(75) Inventor: Kohji Hanawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 227 days.

(21) Appl. No.: 12/478,031

(22) Filed: Jun. 4, 2009

(65) Prior Publication Data

US 2009/0302751 A1 Dec. 10, 2009

(30) Foreign Application Priority Data

Jun. 6, 2008 (JP) ................................. 2008-149263

(51) Int. Cl.
  *H01J 1/62* (2006.01)
  *H01J 63/04* (2006.01)
(52) U.S. Cl. ......... 313/506; 313/500; 313/504; 313/512
(58) Field of Classification Search .................. 313/503, 313/504, 506, 512
  See application file for complete search history.

(56) References Cited

U.S. PATENT DOCUMENTS

| | | | | |
|---|---|---|---|---|
| 6,538,374 | B2* | 3/2003 | Hosokawa | 313/504 |
| 6,768,257 | B1 | 7/2004 | Yamada et al. | |
| 6,900,470 | B2* | 5/2005 | Kobayashi et al. | 257/88 |
| 7,291,968 | B2* | 11/2007 | Fish et al. | 313/500 |
| 7,423,374 | B2* | 9/2008 | Okano | 313/509 |
| 7,501,754 | B2* | 3/2009 | Funamoto et al. | 313/504 |
| 7,507,609 | B2* | 3/2009 | Koo et al. | 438/149 |
| 7,718,452 | B2* | 5/2010 | Sato et al. | 438/29 |
| 7,888,864 | B2* | 2/2011 | Young | 313/506 |
| 2002/0011783 | A1* | 1/2002 | Hosokawa | 313/504 |
| 2002/0158835 | A1* | 10/2002 | Kobayashi et al. | 345/100 |
| 2004/0081751 | A1* | 4/2004 | Nakanishi et al. | 427/108 |
| 2005/0012454 | A1* | 1/2005 | Yamazaki et al. | 313/506 |
| 2005/0051776 | A1* | 3/2005 | Miyagi et al. | 257/72 |
| 2005/0206309 | A1* | 9/2005 | Shibasaki et al. | 313/504 |

(Continued)

FOREIGN PATENT DOCUMENTS

| | | |
|---|---|---|
| JP | 2001-195008 | 7/2001 |
| JP | 2002-124376 | 4/2002 |
| JP | 2002-270372 | 9/2002 |
| JP | 2004-006314 | 1/2004 |
| JP | 2005-031651 | 2/2005 |

(Continued)

OTHER PUBLICATIONS

Japanese Office Action issued on Mar. 21, 2012, in connection with counterpart JP Application No. 2008-149263.

*Primary Examiner* — Nimeshkumar Patel
*Assistant Examiner* — Thomas A Hollweg
(74) *Attorney, Agent, or Firm* — SNR Denton US LLP

(57) ABSTRACT

An organic light emitting device capable of securing favorable electric connection between an auxiliary wiring layer and a second electrode without using a pixel separation mask, a method of manufacturing the same, a display unit, and an electronic device are provided. In the organic light emitting devices, for example, the auxiliary wiring layer, a first electrode as an anode, an insulating film between pixels, an organic layer including a light emitting layer, and the second electrode as a cathode are formed in this order over a substrate. In a region of the organic layer corresponding to the auxiliary wiring layer, an aperture is provided. On the auxiliary wiring layer, a connection section having a plurality of convex sections is formed. In the aperture of the organic layer, the auxiliary wiring layer and the second electrode are electrically connected by the connection section.

13 Claims, 22 Drawing Sheets

U.S. PATENT DOCUMENTS

| | | | |
|---|---|---|---|
| 2005/0253508 A1* | 11/2005 | Okano | 313/506 |
| 2006/0108914 A1* | 5/2006 | Young | 313/503 |
| 2007/0222380 A1* | 9/2007 | Yamazaki et al. | 313/509 |
| 2008/0164474 A1* | 7/2008 | Yamazaki et al. | 257/59 |
| 2009/0286445 A1* | 11/2009 | Yamazaki et al. | 445/24 |
| 2011/0108842 A1* | 5/2011 | Yamazaki et al. | 257/59 |

FOREIGN PATENT DOCUMENTS

| | | |
|---|---|---|
| JP | 2005-093398 | 4/2005 |
| JP | 2006-505908 | 2/2006 |
| JP | 2007-052966 | 3/2007 |
| JP | 2007-103098 | 4/2007 |

* cited by examiner

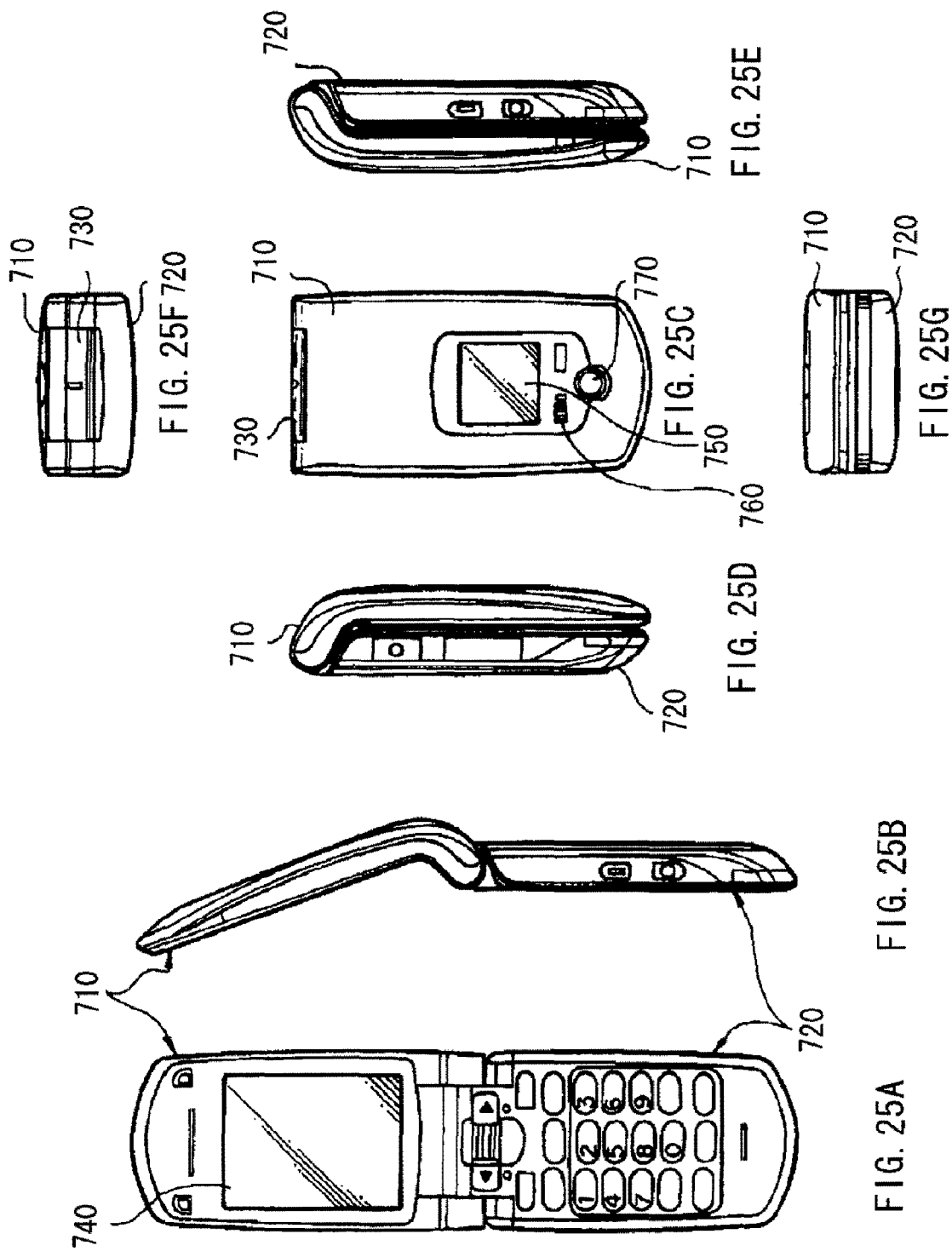

ORGANIC LIGHT EMITTING DEVICE, METHOD OF MANUFACTURING THE SAME, DISPLAY UNIT, AND ELECTRONIC DEVICE

BACKGROUND OF THE INVENTION

1. Field of the Invention

The present invention relates to an organic light emitting device provided with an auxiliary wiring for, for example, inhibiting voltage drop, a method of manufacturing the same, and a display unit using the same.

2. Description of the Related Art

In these years, an organic light emitting display using an organic light emitting device has received attention. In the organic light emitting device, a first electrode, an organic layer including a light emitting layer, and a second electrode are sequentially layered over a substrate. As a material used for the organic layer, there are a low molecular material and a polymer material. Of the foregoing, for forming the low molecular organic layer, vacuum evaporation method is generally used.

Meanwhile, in some cases, to inhibit voltage drop and prevent luminance variation in the screen, an auxiliary wiring insulated from the first electrode is provided on the substrate, and the auxiliary wiring is electrically connected to the second electrode (for example, refer to Japanese Unexamined Patent Application Publication No. 2001-195008).

In the foregoing case, in forming the organic layer by vacuum evaporation method, a pixel separation mask having an aperture correspondingly to a position where the organic layer is to be formed is used to prevent the auxiliary wiring from being covered with the organic layer. After that, the second electrode is formed over almost whole area of the substrate, and thereby the auxiliary wiring and the second electrode are electrically connected.

The foregoing pixel separation mask is used by being set between the substrate and an evaporation source. Thus, as the display is grown in size, the mask itself is demanded to be grown in size. However, if the pixel separation mask is grown in size, deflection is generated and carrying the pixel separation mask becomes difficult, and thus alignment becomes difficult. In result, there is a possibility that the aperture ratio is lowered and the device characteristics are deteriorated. Further, if particles adhered to the pixel separation mask are adhered to the organic layer or the like, such an event may cause short circuit. Accordingly, it is desirable to form the organic layer without using the pixel separation mask. However, if the organic layer is formed without using the pixel separation mask, the organic layer is formed over almost whole area of the substrate, and thus electric connection between the auxiliary wiring and the second electrode is difficult.

Therefore, a technology in which in a step of film-forming an organic layer over a substrate provided with an auxiliary wiring, the organic layer is separated by a side face of the auxiliary wiring by using a step (thickness) of the auxiliary wiring has been proposed (for example, refer to Japanese Unexamined Patent Application Publication No. 2005-93398). That is, the side face of the auxiliary wiring is exposed, and the second electrode is formed to cover the exposed side face, and thereby electric connection between the auxiliary wiring and the second electrode is secured without using the pixel separation mask.

SUMMARY OF THE INVENTION

In the foregoing technology of Japanese Unexamined Patent Application Publication No. 2005-93398, the organic layer is separated by the step of the auxiliary wiring. Thus, the thickness of the auxiliary wiring should be larger than the thickness of the organic layer at minimum. Further, to surely secure the electric connection, taper is desirably formed in the side face of the auxiliary wiring, resulting in complicated manufacturing steps. Furthermore, since the organic layer is formed on the top face of the auxiliary wiring, connection with the second electrode is only secured at the side face of the auxiliary wiring. Accordingly, there is a possibility that the electric connection between the auxiliary wiring and the second electrode becomes insufficient.

In view of the foregoing, in the invention, it is desirable to provide an organic light emitting device capable of securing favorable electric connection between the auxiliary wiring layer and the second electrode without using the pixel separation mask, a method of manufacturing the same, and a display unit.

According to an embodiment of the invention, there is provided an organic light emitting device including a first electrode over a substrate, an auxiliary wiring layer being insulated from the first electrode on the substrate, a first organic layer on the first electrode, including a light emitting layer and an aperture in a region corresponding to the auxiliary wiring layer, a second electrode covering the first organic layer and the aperture, a connection section on the auxiliary wiring layer, electrically connecting the second electrode to the auxiliary wiring layer and having at least one convex section, and a second organic layer in the vicinity of the convex section of the connection section.

According to an embodiment of the invention, there is provided a method of manufacturing an organic light emitting device including the steps of forming an auxiliary wiring layer on a substrate, forming a first electrode being insulated from the auxiliary wiring layer over a substrate, forming a connection section having at least one convex section on the auxiliary wiring layer, forming a first organic layer including a light emitting layer to cover the first electrode and the connection section, selectively removing a region of the first organic layer opposed to the connection section to leave the remaining portion as a second organic layer in the vicinity of the convex section of the connection section, and forming a second electrode to cover the first organic layer and the connection section.

According to an embodiment of the invention, there is provided a display unit including the plurality of organic light emitting devices of the foregoing embodiment of the invention over a substrate.

According to an embodiment of the invention, there is provided an electronic device mounting the display unit of the embodiment of the invention.

In the method of manufacturing an organic light emitting device according to the embodiment of the invention, the connection section having at least one convex section is formed on the auxiliary wiring layer provided on the substrate, and the first organic layer is formed to cover the connection section and the first electrode. After that, the region of the first organic layer opposed to the connection section is selectively fused. Thereby, the fused region of the first organic layer is pooled in the vicinity of the convex section of the connection section, is solidified, and is left as the second organic layer. Thereby, at least part of the convex section formed on the auxiliary wiring layer is exposed. After that, the second electrode is formed to cover the first organic layer and the connection section and thereby the auxiliary wiring layer and the second electrode are electrically connected through the connection section.

In the organic light emitting device and the display unit of the embodiments of the invention, the aperture is provided in the region of the first organic layer corresponding to the auxiliary wiring layer. Thereby, the auxiliary wiring layer and the second electrode are electrically connected by the connection section formed on the auxiliary wiring layer. Since the connection section has at least one convex section, the surface area is increased more than in a case that the connection section is composed of a flat face, and electric contact area with the second electrode is easily secured.

According to the method of manufacturing an organic light emitting device according to the embodiment of the invention, the region of the first organic layer formed to cover the first electrode and the connection section on the auxiliary wiring layer that is opposed to the connection section is selectively fused, and the fused region of the first organic layer is left as the second organic layer in the vicinity of the convex section. After that, the second electrode is formed to cover the connection section and the first organic layer. Thus, electric connection between the auxiliary wiring layer and the second electrode is able to be favorably secured without using the pixel separation mask.

According to the organic light emitting device and the display unit of the embodiments of the invention, the aperture is provided in the region of the first organic layer corresponding to the auxiliary wiring layer. In addition, the connection section having at least one convex section is provided on the auxiliary wiring layer. Thus, electric connection between the auxiliary wiring layer and the second electrode is able to be favorably secured. Thereby, voltage drop in the second electrode is able to be inhibited, and luminance variation in the screen is able to be inhibited. Accordingly, an electronic device with favorable display quality is able to be realized.

Other and further objects, features and advantages of the invention will appear more fully from the following description.

BRIEF DESCRIPTION OF THE DRAWINGS

FIGS. 25A to 25G are perspective views illustrating an appearance of a fifth application example of the display unit of the embodiments.

DETAILED DESCRIPTION OF THE PREFERRED EMBODIMENTS

Embodiments of the invention will be hereinafter described in detail with reference to the drawings.

First Embodiment

Figure 1:
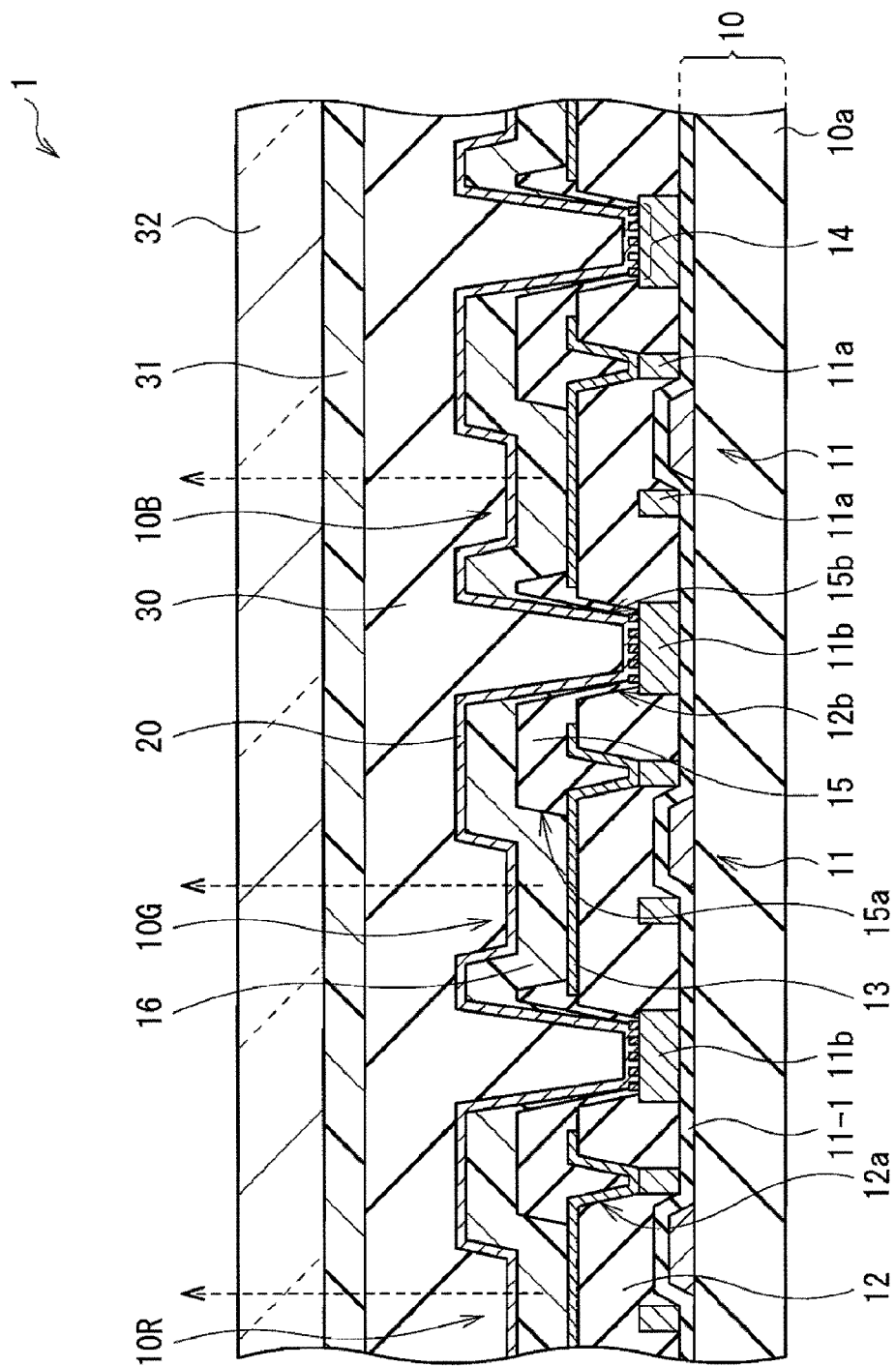
FIG. 1 is a cross sectional view illustrating a structure of a display unit according to a first embodiment of the invention.

FIG. 1 shows a cross sectional structure of a display unit 1 according to a first embodiment of the invention. The display unit 1 is suitably used as a thin organic light emitting display in which a driving panel 10 and a sealing panel 32 are oppositely arranged, and the whole areas of the driving panel 10 and the sealing panel 32 are bonded together by an adhesive layer 31 made of, for example, a thermoset resin. In the driving panel 10, for example, an organic light emitting device 10R generating red light, an organic light emitting device 10G generating green light, and an organic light emitting device 10B generating blue light are sequentially provided in a state of matrix as a whole over a substrate 10a including an insulating material such as glass, with a TFT 11 and a planarizing layer 12 in between.

The TFT 11 is a drive element corresponding to the respective organic light emitting devices 10R, 10G, 10B. The organic light emitting devices 10R, 10G, 10B are driven by active matrix system. A gate electrode (not illustrated) of the TFT 11 is connected to a scanning circuit (not illustrated). A source and a drain (either not illustrated) are connected to a wiring layer 11a provided with an interlayer insulating film 11-1 including, for example, silicon oxide or PSG (Phospho-Silicate Glass) in between. The wiring layer 11a is connected to the source and the drain of the TFT 11 through a connection hole (not illustrated) provided in the interlayer insulating film 11-1, and is used as a signal line. The wiring layer 11a is made of, for example, a single layer film including aluminum (Al) single substance or an aluminum alloy, a titanium (Ti)/aluminum laminated film, or a titanium/aluminum/titanium three-layer film. The structure of the TFT 11 is not particularly limited. For example, the structure thereof may be bottom gate type or top gate type.

The planarizing layer 12 is intended to planarize the surface of the substrate 10a provided with the TFT 11 and uniformly form the film thickness of each layer of the organic light emitting devices 10R, 10G, 10B. The planarizing layer 12 also plays a role to prevent an after-mentioned first electrode 13 and the wiring layer 11a from being contacted with each other unnecessarily. The planarizing layer 12 is provided with an aperture 12a for connecting the first electrode 13 to the wiring layer 11a, and an aperture 12b correspondingly to an auxiliary wiring layer 11b, in each of the organic light emitting devices 10R, 10G, 10B. As a material of the planarizing layer 12, an organic material such as a polyimide resin, an acryl resin, and a novolac resin, or an inorganic material such as silicon oxide ($SiO_2$) is able to be used.

In the organic light emitting devices 10R, 10G, 10B, for example, the first electrode 13 as an anode, an insulating film between pixels 15, an organic layer (first organic layer) 16 including a light emitting layer, and a second electrode 20 as a cathode are layered in this order from the substrate 10a side, with the TFT 11 and the planarizing layer 12 in between. Further, the substrate 10a is provided with the auxiliary wiring layer 11b electrically insulated from the first electrode 13. On the auxiliary wiring layer 11b, a connection section 14 is provided. On the second electrode 20, a passivation film 30 is formed according to needs.

The auxiliary wiring layer 11b is intended to inhibit voltage drop in the second electrode 20. The auxiliary wiring layer 11b is formed, for example, in the aperture 21b of the planarizing layer 12, an aperture 15b of the insulating film between pixels 15, and an aperture 16a of the organic layer 16 (all described later). The auxiliary wiring layer 11b is formed from, for example, the same material as that of the wiring layer 11a. Thereby, in the after-mentioned manufacturing steps, the auxiliary wiring layer 11b is able to be formed in the same step as that of the wiring layer 11a. The material and the structure of the auxiliary wiring layer 11b are not necessarily identical with those of the wiring layer 11a.

The first electrode 13 functions as an electrode to inject positive hole into the organic layer 16 (positive hole transport layer 17). If the first electrode 13 is used as a reflecting layer, the first electrode 13 desirably has high reflectance as much as possible to increase light emission efficiency. Examples of component materials of the first electrode 13 include a simple substance or an alloy of a metal element such as silver (Ag), aluminum, molybdenum (Mo), and chromium (Cr). The first electrode 13 is, for example, from 100 nm to 500 nm both inclusive thick. The first electrode 13 may have a single layer structure or a laminated structure composed of a plurality of layers.

The connection section 14 is intended to electrically connect the auxiliary wiring layer 11b to the second electrode 20. The connection section 14 includes, for example, a plurality of convex sections. A specific structure of the connection section 14 will be described later.

The insulating film between pixels 15 is provided to secure insulation between the first electrode 13 and the second electrode 20/the auxiliary wiring layer 11b respectively. The insulating film between pixels 15 includes, for example, an insulative material such as silicon oxide and polyimide. The insulating film between pixels 15 is provided with the aperture 15a correspondingly to light emitting regions in the organic light emitting devices 10R, 10G, 10B, and the aperture 15b correspondingly to the auxiliary wiring layer 11b.

The organic layer 16 is formed on the first electrode 13 and the insulating film between pixels 15. The structure and the material of the organic layer 16 will be described later.

The second electrode 20 functions as an electrode to inject electron into the organic layer 16 (electron transport layer 19). Examples of component materials of the second electrode 20 include a material having transparent characteristics. Examples thereof include a metal or an alloy of silver (Ag), aluminum (Al), and magnesium (Mg), or indium tin oxide (ITO), zinc oxide (ZnO), and indium zinc oxide (IZO).

The passivation film 30 is, for example, from 500 nm to 10000 nm both inclusive thick. The passivation film 30 is composed of transparent dielectrics. The passivation film 30 includes, for example, silicon oxide ($SiO_2$), silicon nitride (SiN) or the like.

The sealing panel 32 is located on the second electrode 20 side of the driving panel 10, and is intended to seal the organic light emitting devices 10R, 10G, 10B together with the adhesive layer 31. The sealing panel 32 is made of a material such as glass transparent to light generated in the organic light emitting devices 10R, 10G, 10B. The sealing panel 32 is provided with a red color filter, a green color filter, and a blue color filter (not illustrated) respectively corresponding to arrangement of the organic light emitting devices 10R, 10G, 10B. Thereby, the light generated respectively in the organic light emitting devices 10R, 10G, 10B is extracted as three primary color light, outside light reflected by each layer is absorbed, and the contrast is improved. The color filter may be provided on the driving panel 10 side.

Figure 2:
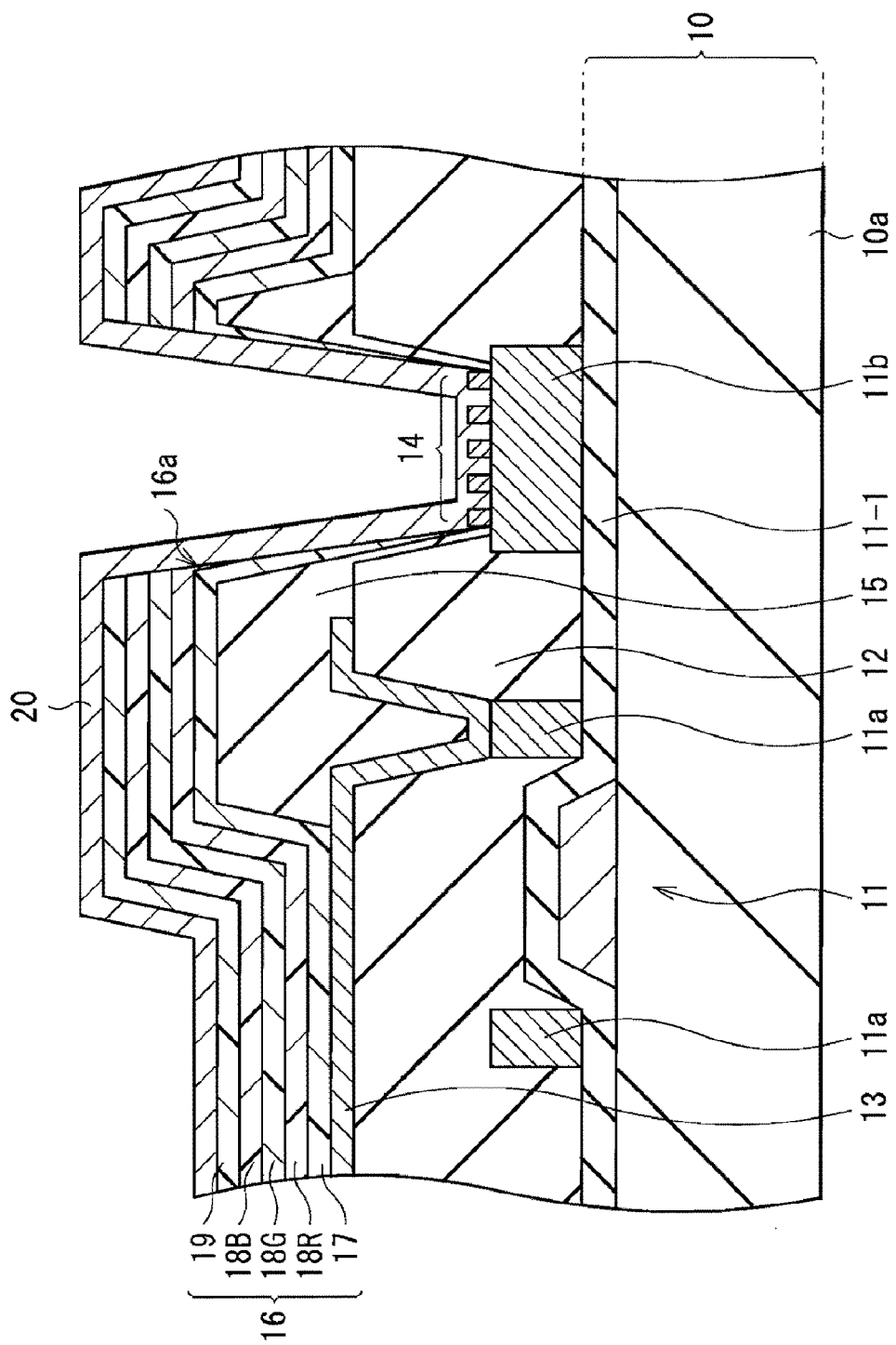
FIG. 2 is an enlarged cross sectional view of the organic light emitting device illustrated in FIG. 1.

Subsequently, a description will be given of a specific structure of the organic layer 16 with reference to FIG. 2. FIG. 2 is a view of an enlarged region corresponding to each organic light emitting device in FIG. 1.

The organic layer 16 has the same structure without relation to light emission colors of the organic light emitting devices 10R, 10G, 10B. In the organic layer 16, for example, the positive hole transport layer 17, a red light emitting layer 18R, a green light emitting layer 18G, a blue light emitting layer 18B, and an electron transport layer 19 are layered from the first electrode 13 side. The organic layer 16 has the aperture 16a in the region corresponding to the auxiliary wiring layer 11b.

The positive hole transport layer 17 is intended to increase the efficiency of positive hole injection into each light emitting layer. In this embodiment, the positive hole transport layer 17 also functions as a positive hole injection layer. The positive hole transport layer 17 is, for example, about 40 nm thick, and includes 4,4',4"-tris(3-methylphenylphenylamino) triphenyl amine (m-MTDATA) or α-naphthylphenyldiamine (α-NPD).

The red light emitting layer 18R generates red light by recombination between part of positive hole injected from the first electrode 13 through the positive hole transport layer 17 and part of electron injected from the second electrode 20 through the electron transport layer 19 by impressing an electric field. The green light emitting layer 18G generates green light by recombination between part of positive hole injected from the first electrode 13 through the positive hole transport layer 17 and part of electron injected from the second electrode 20 through the electron transport layer 19 by impressing an electric field. The blue light emitting layer 18B generates blue light by recombination between part of positive hole injected from the first electrode 13 through the positive hole transport layer 17 and part of electron injected from the second electrode 20 through the electron transport layer 19 by impressing an electric field.

The red light emitting layer 18R contains a red light emitting material, and also may contain one or more of a positive hole transport material, an electron transport material, and a both electric charge transport material. The red light emitting material may be fluorescent or phosphorescent. In this embodiment, the red light emitting layer 18R is, for example, about 5 nm thick, and includes a compound in which 30 wt % of 2,6-bis[(4'-methoxydiphenylamino)styril]-1,5-dicyanonaphthalene (BSN) is mixed with 4,4-bis(2,2-diphenylvinyl) biphenyl (DPVBi).

The green light emitting layer 18G contains a green light emitting material, and also may contain one or more of a positive hole transport material, an electron transport material, and a both electric charge transport material. The green light emitting material may be fluorescent or phosphorescent. In this embodiment, the green light emitting layer 18G is, for example, about 10 nm thick, and includes a compound in which 5 wt % of Coumarn 6 is mixed with DPVBi.

The blue light emitting layer 18B contains a blue light emitting material, and also may contain one or more of a positive hole transport material, an electron transport material, and a both electric charge transport material. The blue light emitting material may be fluorescent or phosphorescent. In this embodiment, the blue light emitting layer 18B is, for example, about 30 nm thick, and includes a compound in which 2.5 wt % of 4,4'-bis[2-{4-(N,N-diphenylamino)phenyl}vinyl]biphenyl (DPAVBi) is mixed with DPVBi.

The electron transport layer 19 is intended to increase efficiency of electron injection into each color light emitting layer. The electron transport layer 19 is, for example, about 20 nm thick, and includes 8-hydroxyquinoline aluminum ($Alq_3$).

Figure 3:
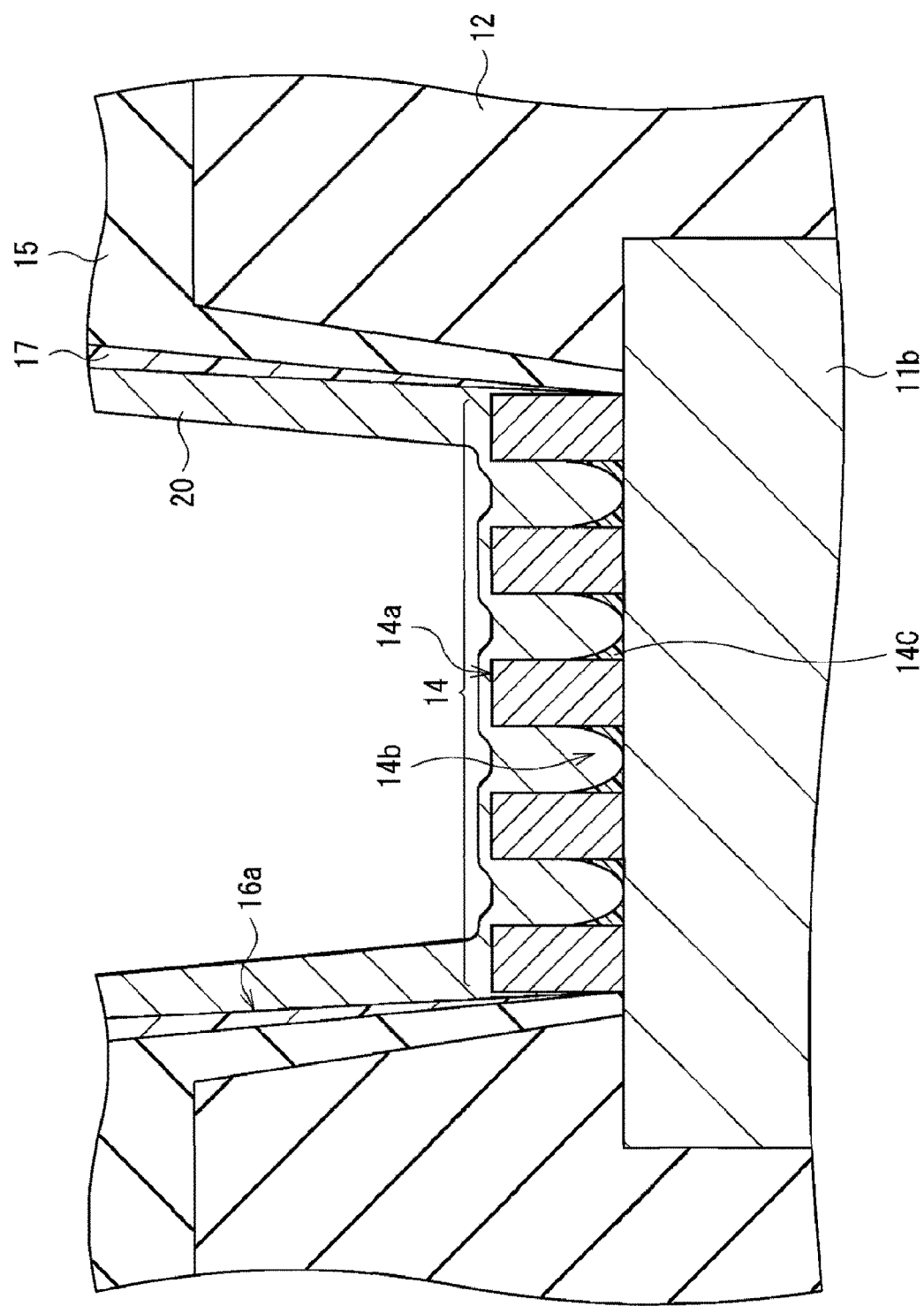
FIG. 3 is an enlarged cross sectional view of a region in which the connection section illustrated in FIG. 1 is formed.

Subsequently, a description will be given of a specific structure of the connection section 14 with reference to FIG. 3. FIG. 3 is an enlarged view of a region in which the connection section is formed in FIG. 1.

The connection section 14 includes, for example, a plurality of convex sections 14a formed on the auxiliary wiring layer 11b. The respective convex sections 14a include a material having electric conductivity such as a simple substance and an alloy of a metal element such as silver (Ag), aluminum, molybdenum (Mo), and chromium (Cr). The number of convex sections 14a in one connection section 14 is, for example, 2 to 10. The distance between each convex section 14a is, for example, from 3 µm to 10 µm both inclusive. The thickness (height) of each convex section 14a is, for example, from 100 nm to 1000 nm both inclusive.

In this embodiment, the plurality of convex sections 14a include the same material as that of the first electrode 13 and have the same thickness as that of the first electrode 13. Thereby, the convex section 14a and the first electrode 13 are able to be formed in the same step. In a region in the vicinity of the convex section 14a, that is, at the bottom face of a region between the plurality of convex sections 14a (referred to as concave section 14b), an organic layer (second organic layer) 14c is provided. The organic layer 14c is formed by, for example, fusing and solidifying the material composing the organic layer 16. The second electrode 20 is formed to cover the plurality of convex sections 14a and the organic layer 14c. The top face and part of side faces of the respective convex sections 14a are buried by the second electrode 20. Further, in this embodiment, the concave section 14b is formed down to the top face of auxiliary wiring layer 11b. The organic layer 14c is formed being contacted with the top face of the auxiliary wiring layer 11b.

The foregoing display unit 1 is able to be manufactured by, for example, as follows.

Figure 4:
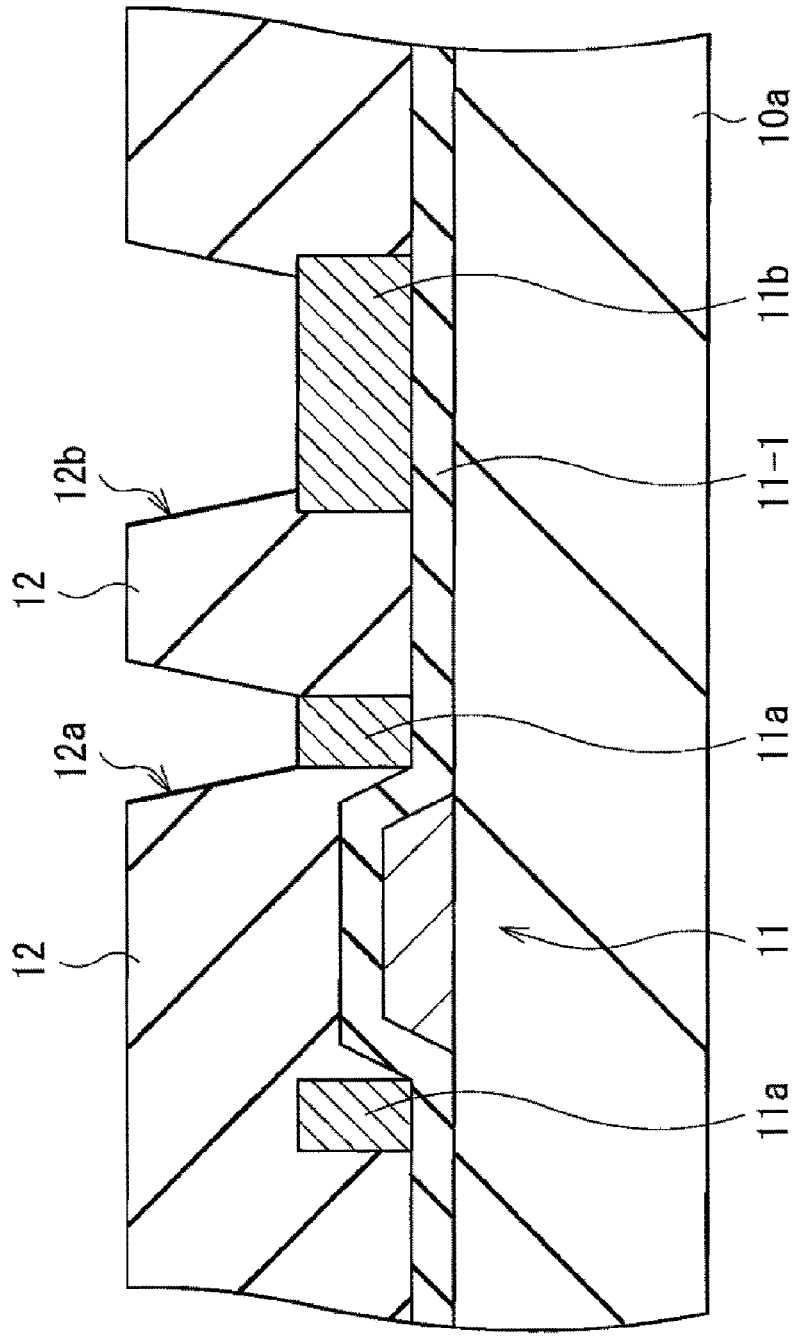
FIG. 4 is a cross sectional view illustrating a method of manufacturing the display unit illustrated in FIG. 1 in order of steps.

FIG. 4 to FIG. 9 illustrate a method of manufacturing the display unit 1 in order of steps. First, as illustrated in FIG. 4, on the substrate 10a including the foregoing material, the TFT 11 and the interlayer insulating film 11-1 are formed. Subsequently, on the formed interlayer insulating film 11-1, the wiring layer 11a including the foregoing material is formed. At this time, on the interlayer insulating film 11-1, a single layer film or a laminated film including the foregoing material is film-formed by, for example, sputtering method or the like, and then the wiring layer 11a and the auxiliary wiring layer 11b are concurrently pattern-formed by using, for example, photolithography method. After that, the whole area of the substrate 10a is coated with the foregoing material by, for example, spin coat method. The planarizing layer 12 is provided with patterning into a given shape by exposure and development. The aperture 12a is formed in a region corresponding to the wiring layer 11a, and the aperture 12b is formed in a region corresponding to the auxiliary wiring layer 11b.

Figure 5:
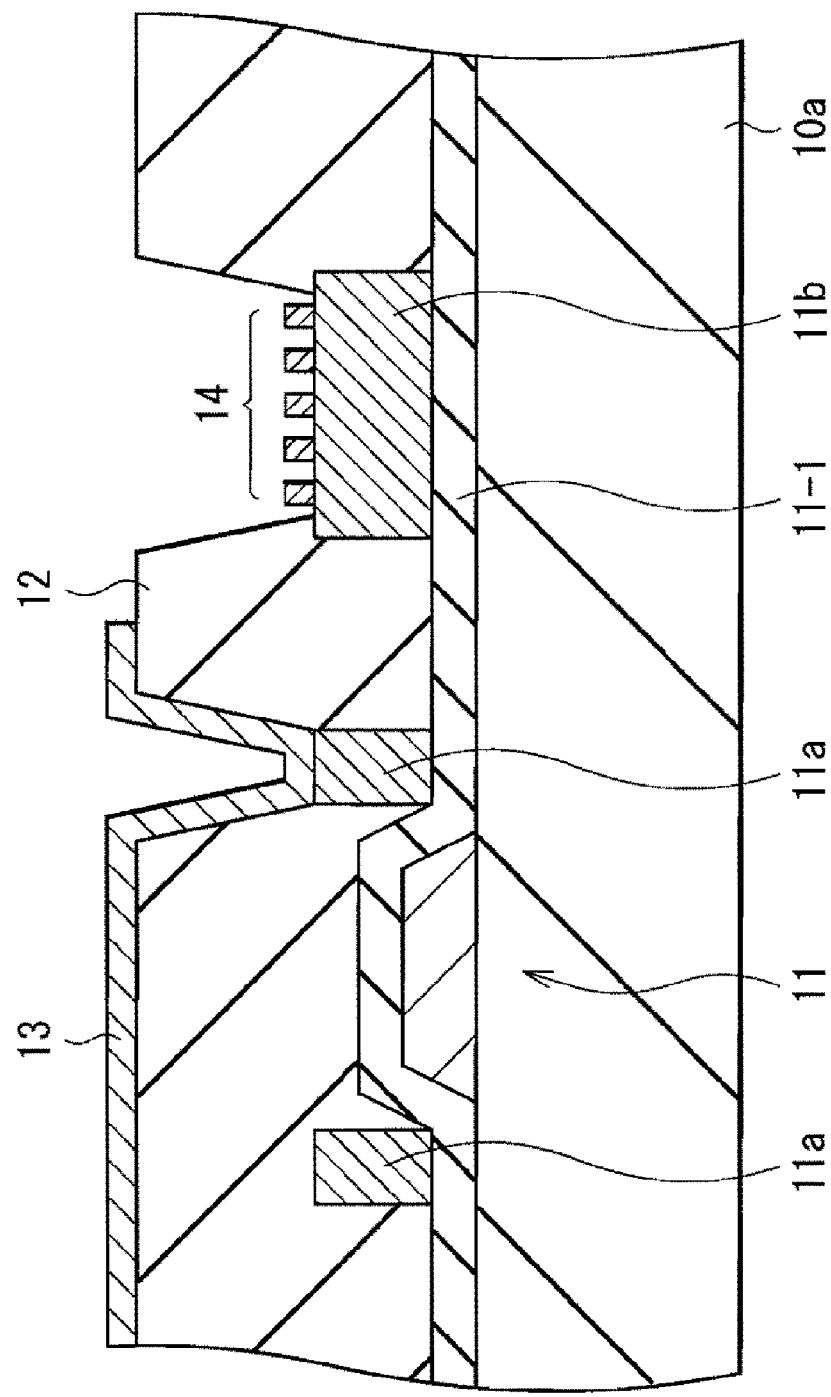
FIG. 5 is a cross sectional view illustrating a step following FIG. 4.

Subsequently, as illustrated in FIG. 5, the first electrode 13 including the foregoing material with the foregoing thickness is formed on the planarizing layer 12. At this time, the connection section 14 is preferably formed in the same step as that of the first electrode 13. That is, a metal film including the foregoing material is film-formed over the whole area of the substrate 10a by, for example, sputtering method. After that, a section used as the first electrode 13 and a section used as the connection section 14 are provided with concurrent patterning by using photolithography method.

Figure 6:
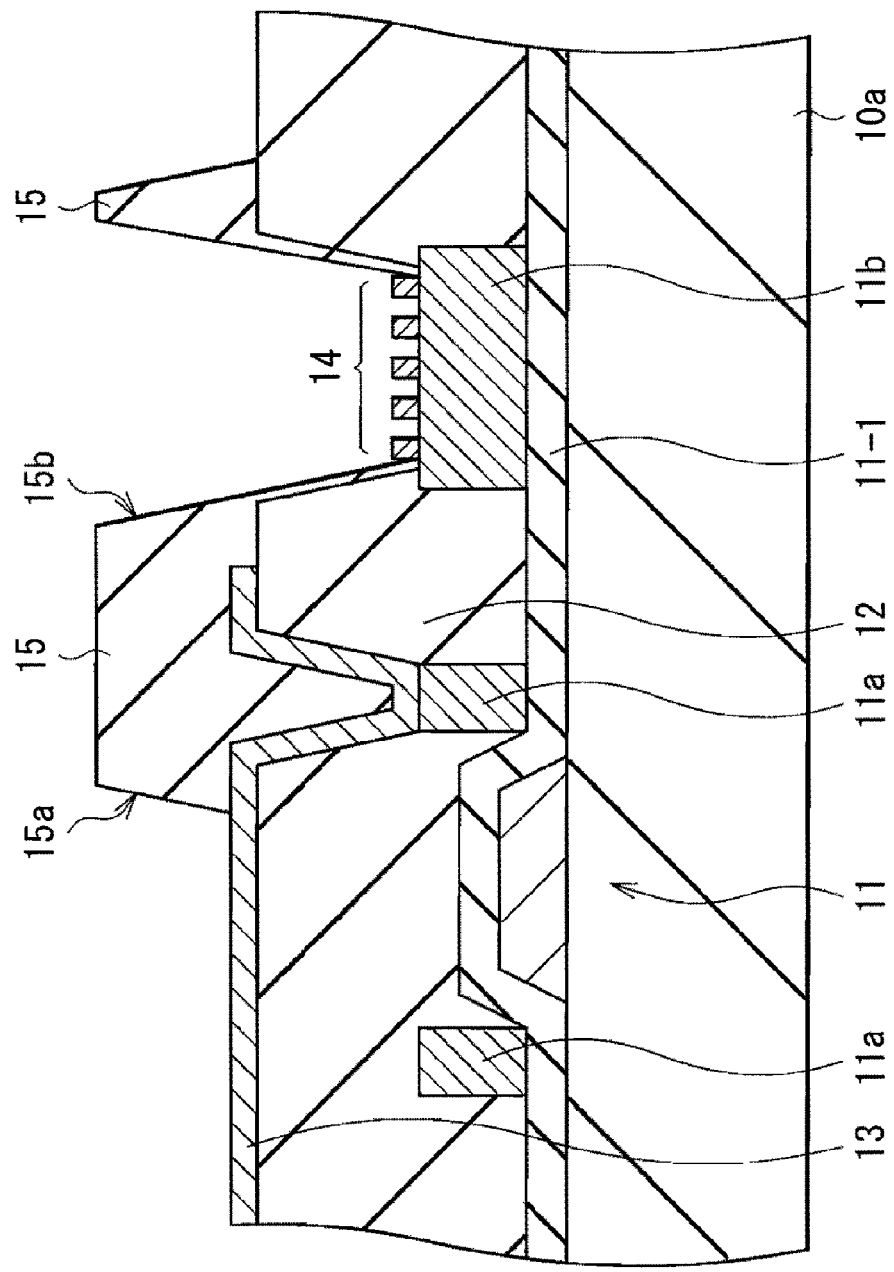
FIG. 6 is a cross sectional view illustrating a step following FIG. 5.

Next, as illustrated in FIG. 6, the insulating film between pixels 15 including the foregoing material is deposited over the whole area of the substrate 10a by, for example, CVD (Chemical Vapor Deposition) method. Apertures 15a and 15b are formed by selectively removing a section of the insulating film between pixels 15 corresponding to the light emitting region and a section of the insulating film between pixels 15 corresponding to the auxiliary wiring layer 11b by using, for example, lithography technology.

Figure 7:
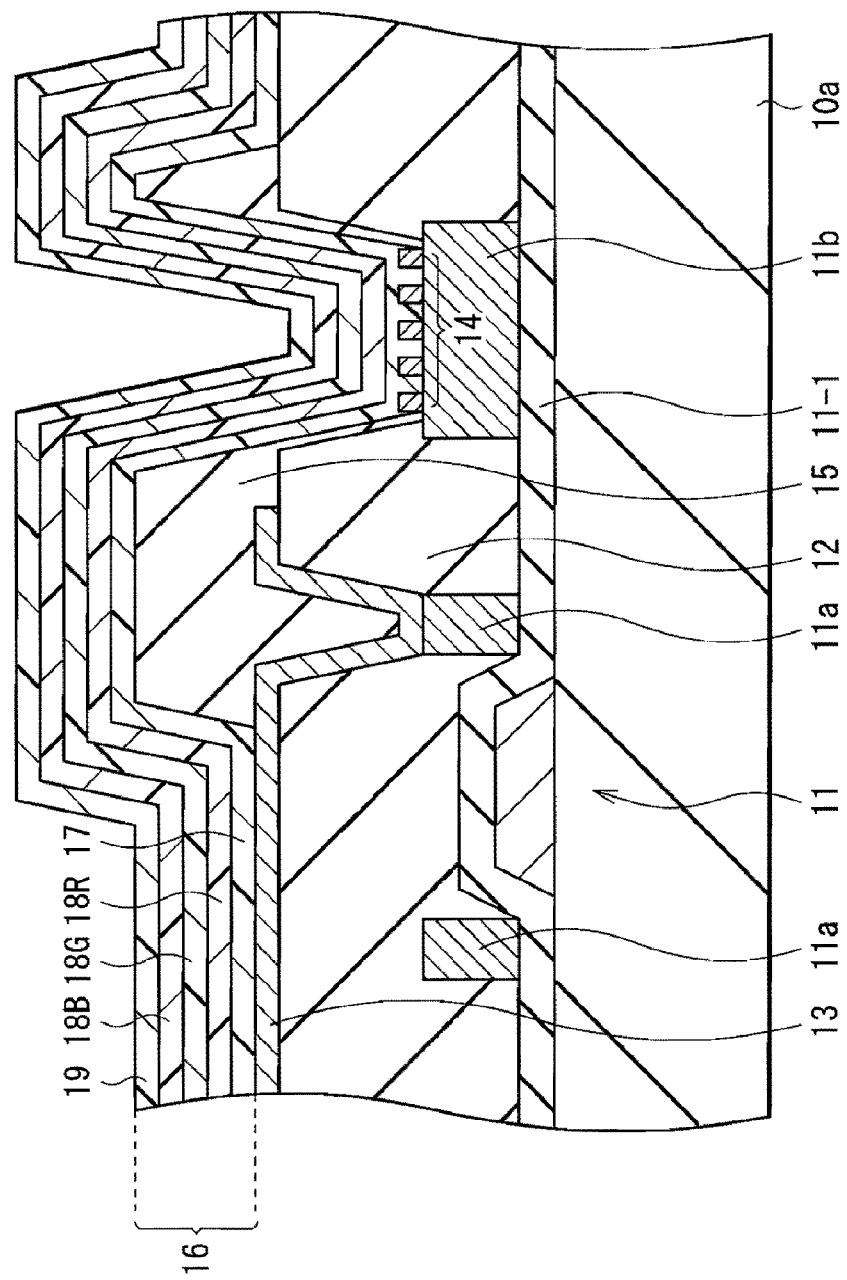
FIG. 7 is a cross sectional view illustrating a step following FIG. 6.

Subsequently, as illustrated in FIG. 7, the positive hole transport layer 17, the red light emitting layer 18R, the green light emitting layer 18G, the blue light emitting layer 18B, and the electron transport layer 19 that include the foregoing material are sequentially deposited over the whole area of the substrate 10a, and thereby the organic layer 16 is formed.

Figure 8:
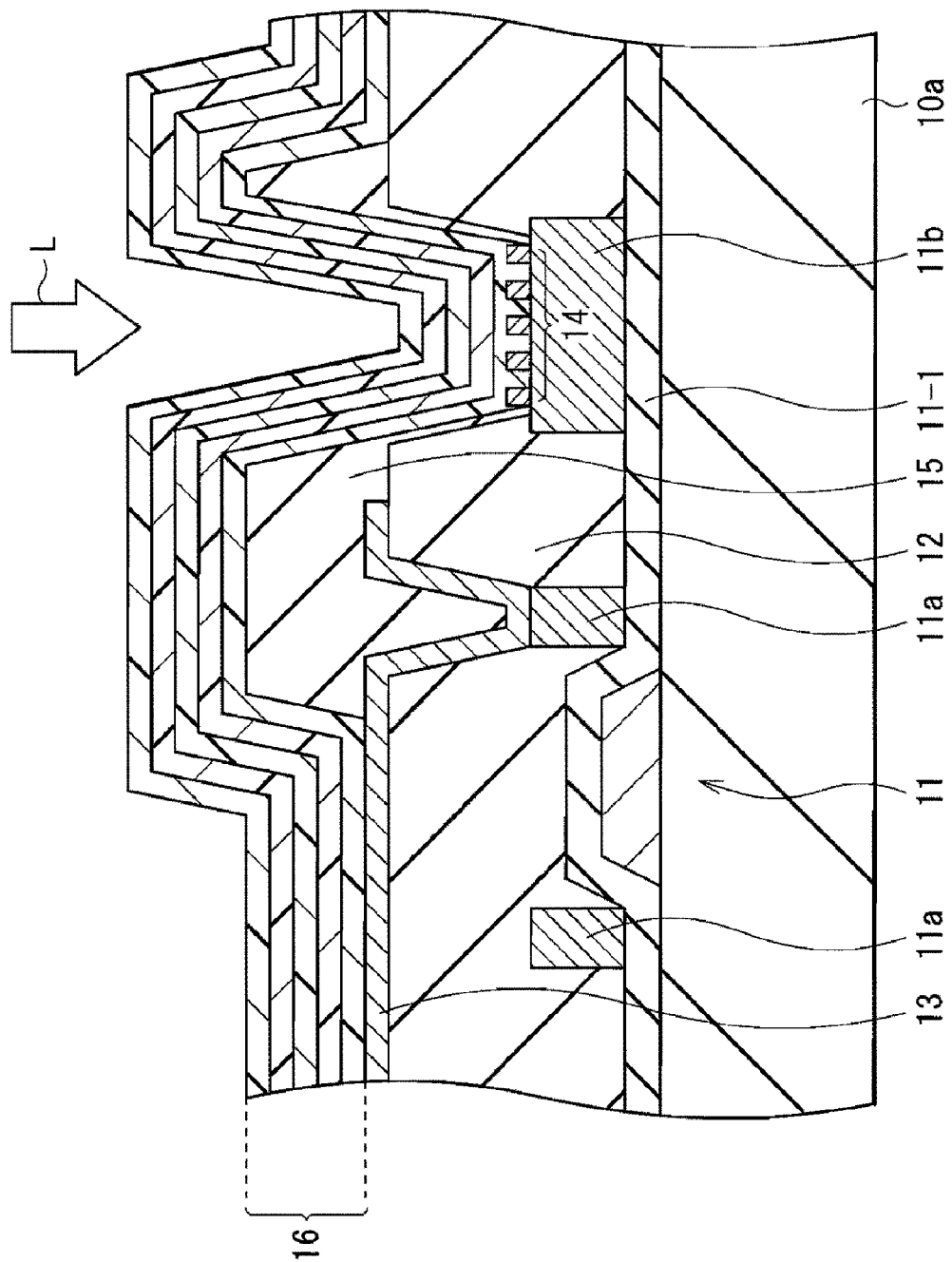
FIG. 8 is a cross sectional view illustrating a step following FIG. 7.
Figure 9:
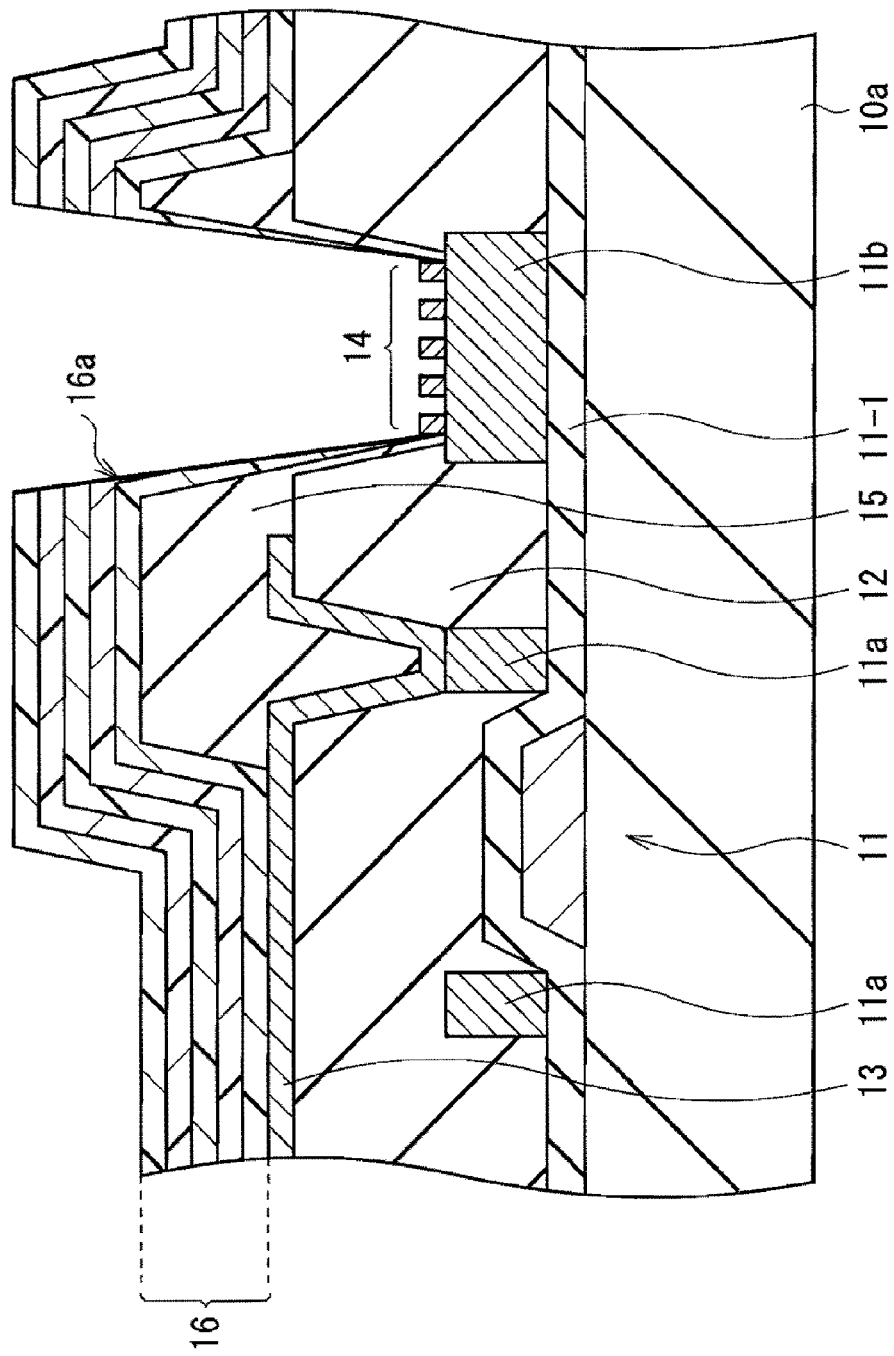
FIG. 9 is a cross sectional view illustrating a step following FIG. 8.

Next, as illustrated in FIG. 8, the region of the formed organic layer 16 corresponding to the auxiliary wiring layer 11b is irradiated with laser light (radiant ray) L. The irradiated light is absorbed into the auxiliary wiring layer 11b and thereby temperature is increased. In result, the organic layer 16 on the auxiliary wiring layer 11b is fused. At this time, intensity and irradiation time of the laser light L and light absorption ratio of the component material of the auxiliary wiring layer and the like are adjusted as appropriate, and thereby temperature is increased to the degree higher than the fusing point of the organic layer 16. By such laser irradiation, the aperture 16a is formed in a region of the organic layer 16 corresponding to the auxiliary wiring layer 11b (FIG. 9). Further, the organic layer 16 fused by laser irradiation is pooled in the concave section 14b of the connection section 14 by the surface tension thereof. The pooled organic layer 16 is directly cooled and solidified. The solidified portion is left as the organic layer 14c. Accordingly, the top face and part of the side faces of the convex sections 14a are exposed.

Subsequently, the second electrode 20 including the foregoing material is formed over the whole area of the substrate 10a by, for example, sputtering method or the like. Thereby, in the aperture 16a of the organic layer 16, the second electrode 20 is electrically connected to the auxiliary wiring layer 11b. After that, the passivation film 30 including the foregoing material is formed on the second electrode 20.

Finally, after the passivation film 30 is coated with the adhesive layer 31 including, for example, a thermoset resin, the sealing panel 32 is bonded to the passivation film 30 with the adhesive layer 31 in between. After that, relative positions of the color filter of the sealing panel 32 to the organic light emitting devices 10R, 10G, and 10B are aligned, and then given heat treatment is provided to harden the thermoset resin of the adhesive layer 31. Accordingly, the display unit 1 illustrated in FIG. 1 is completed.

In the display unit 1 of this embodiment, when a given voltage is applied between the first electrode 13 and the second electrode 20, a current is injected into the red light emitting layer 18R, the green light emitting layer 18G, and the blue light emitting layer 18B of the organic layer 16, positive holes and electrons recombine with each other, and thereby red light is generated in the red light emitting layer 18R, green light is generated in the green light emitting layer 18G, blue light is generated in the blue light emitting layer 18B. The red light, the green light, and the blue light are transmitted through the color filter formed for the sealing panel 32, and thereby are extracted as three primary color light.

Since the organic layer 16 has the aperture 16a in the region corresponding to the auxiliary wiring layer 11b, the auxiliary wiring layer 11b is electrically connected to the second electrode 20 by the connection section 14 formed on the auxiliary wiring layer 11b. Thereby, voltage drop in the second electrode 20 is inhibited. Further, since the connection section 14 has the plurality of convex sections 14a, the top face and at least part of the side faces of the respective convex sections 14a are covered with the second electrode 20, and thus electric contact area with the second electrode 20 is increased.

The number of the convex sections 14a, the distance between the respective convex sections 14a, the height thereof and the like are not particularly limited. However, as the pattern thereof is finer, the surface area of the connection section 14 is more enlarged. Thus, in the case where the pattern is finer, electric connection is able to be more effectively secured.

As described above, in this embodiment, the aperture 16a is provided in the region of the organic layer 16 corresponding to the auxiliary wiring layer 11b, the connection section 14 is provided on the auxiliary wiring layer 11b, and the second electrode 20 is formed to cover the connection section 14. Thus, electric connection between the auxiliary wiring layer 11b and the second electrode 20 is able to be secured without using the pixel separation mask. Further, since the connection section 14 has the plurality of convex sections 14a, electric contact area between the second electrode 20 and the connection section 14 is able to be increased, and electric connection between the auxiliary wiring layer 11b and the second electrode 20 is able to be favorably secured. Accordingly, voltage drop in the second electrode is able to be inhibited, and luminance variation in the screen is able to be inhibited.

FIRST MODIFIED EXAMPLE

Figure 10:
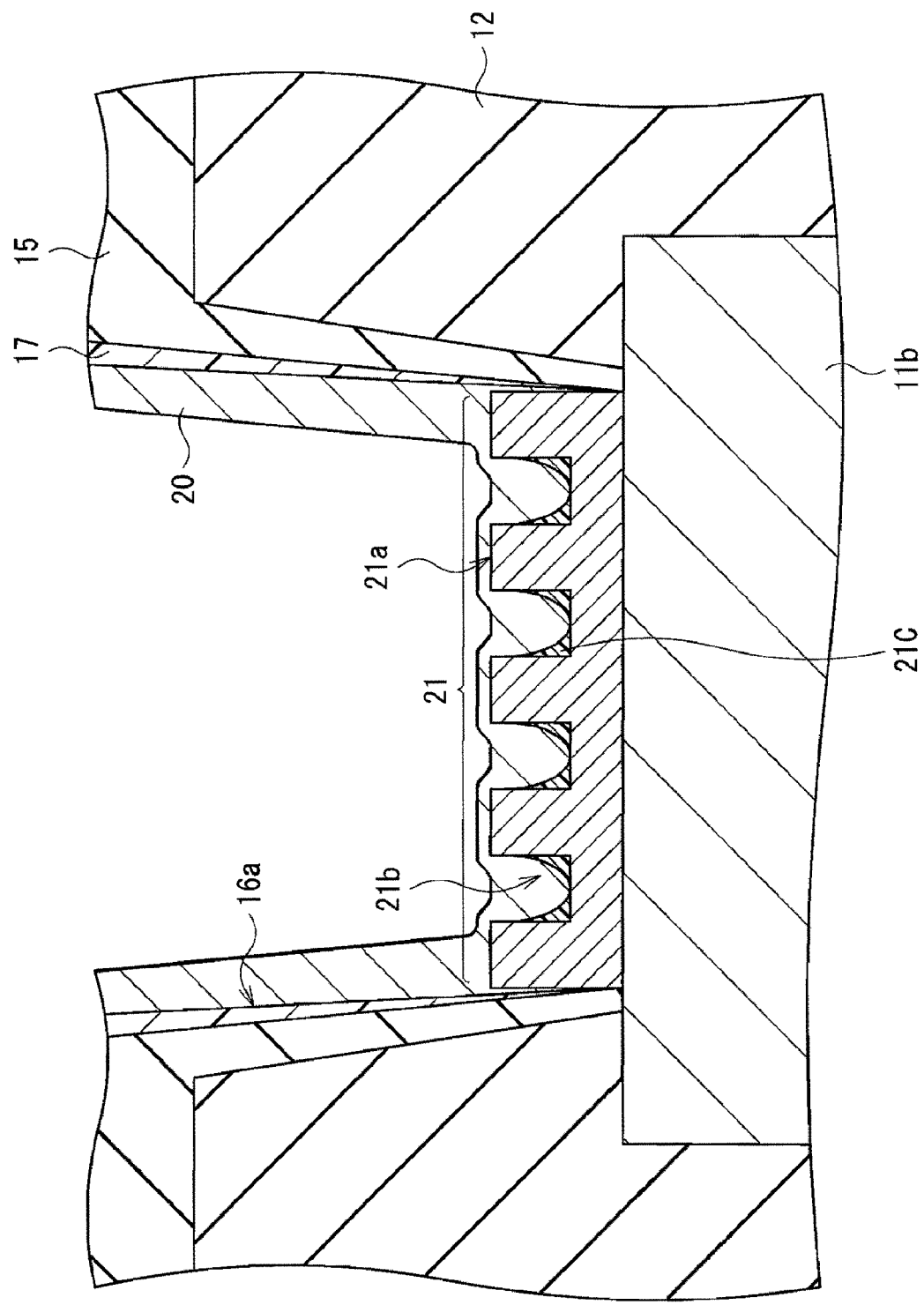
FIG. 10 is an enlarged cross sectional view of a region in which a connection section according to a modified example of the first embodiment of the invention is formed.

FIG. 10 illustrates a cross sectional structure of a connection section 21 according to a first modified example of the foregoing first embodiment. This modified example has a structure similar to that of the display unit 1 of the foregoing first embodiment except for the structure of the connection section 21. Thus, the same symbols are affixed to the elements similar to those of the foregoing first embodiment, and the description thereof will be omitted as appropriate.

The connection section 21 has a plurality of convex sections 21a. A region between the plurality of convex sections 21a is a concave section 21b. In this modified example, the concave section 21b is not formed down to the auxiliary wiring layer 11b, and a partial region on the top face side of the connection section 21 is patterned into a concave and convex shape. At the bottom face of the concave section 21b, an organic layer 21c is formed. As a component material of the connection section 21, a material similar to that of the connection section 14 of the foregoing first embodiment is able to be used. Further, the connection section 21 is able to be formed in the same manner as that of the connection section 14 of the foregoing first embodiment, except that patterning is made so that the concave section 21b is not formed down to the auxiliary wiring layer 11b. Further, as the foregoing organic layer 14c, the organic layer 21c is formed by fusing and solidifying the organic layer 16.

As described above, the concave section 21b of the connection section 21 is not necessarily formed down to the auxiliary wiring layer 11b, and it is enough that a space with a size in which the fused organic layer is able to be pooled is formed. Even in the case of such a structure, effect similar to that of the foregoing first embodiment is able to be obtained.

SECOND MODIFIED EXAMPLE

Figure 11:
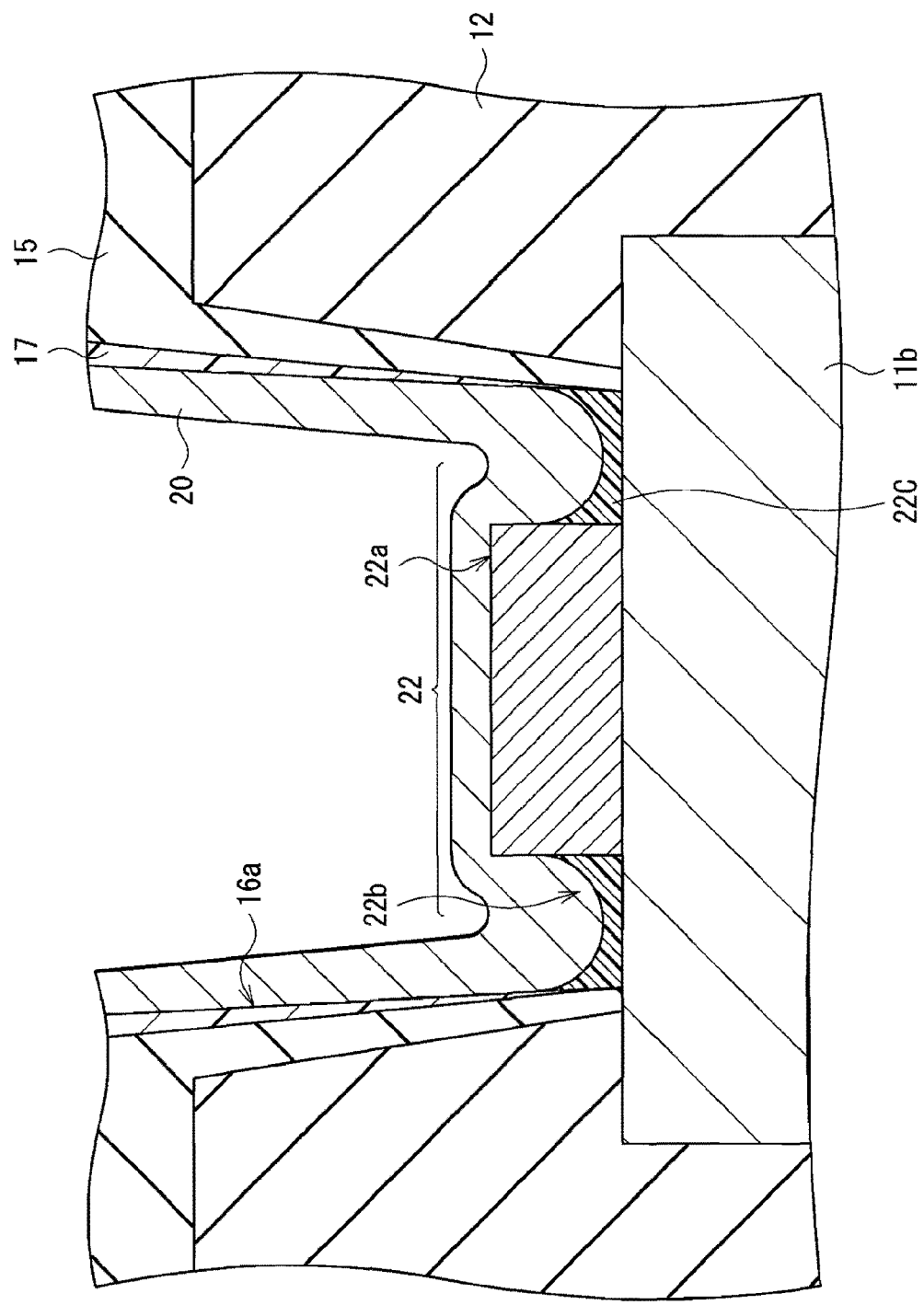
FIG. 11 is an enlarged cross sectional view of a region in which a connection section according to another modified example of the first embodiment of the invention is formed.

FIG. 11 illustrates a cross sectional structure of a connection section 22 according to a second modified example of the foregoing first embodiment. This modified example has a structure similar to that of the display unit 1 of the foregoing first embodiment except for the structure of the connection section 22. Thus, the same symbols are affixed to the elements similar to those of the foregoing first embodiment, and the description thereof will be omitted as appropriate.

The connection section 22 includes one convex section 22a. In a region in the vicinity of the convex section 22a, that is, in a concave section 22b, an organic layer 22c is formed. As a component material of the connection section 22, a material similar to that of the connection section 14 of the foregoing first embodiment is able to be used. The connection section 22 is able to be pattern-formed in the same manner as that of the connection section 14 of the foregoing first embodiment, except that the number of the convex section 22a is different. Further, as the foregoing organic layer 14c, the organic layer 22c is formed by fusing and solidifying the organic layer 16.

As described above, it is enough that at least one convex section 22a of the connection section 22 exists. Due to such a structure, compared to a case of a planar structure, the contact area with the second electrode 20 is easily secured. Therefore, effect similar to that of the foregoing first embodiment is able to be obtained.

Second Embodiment

Figure 12:
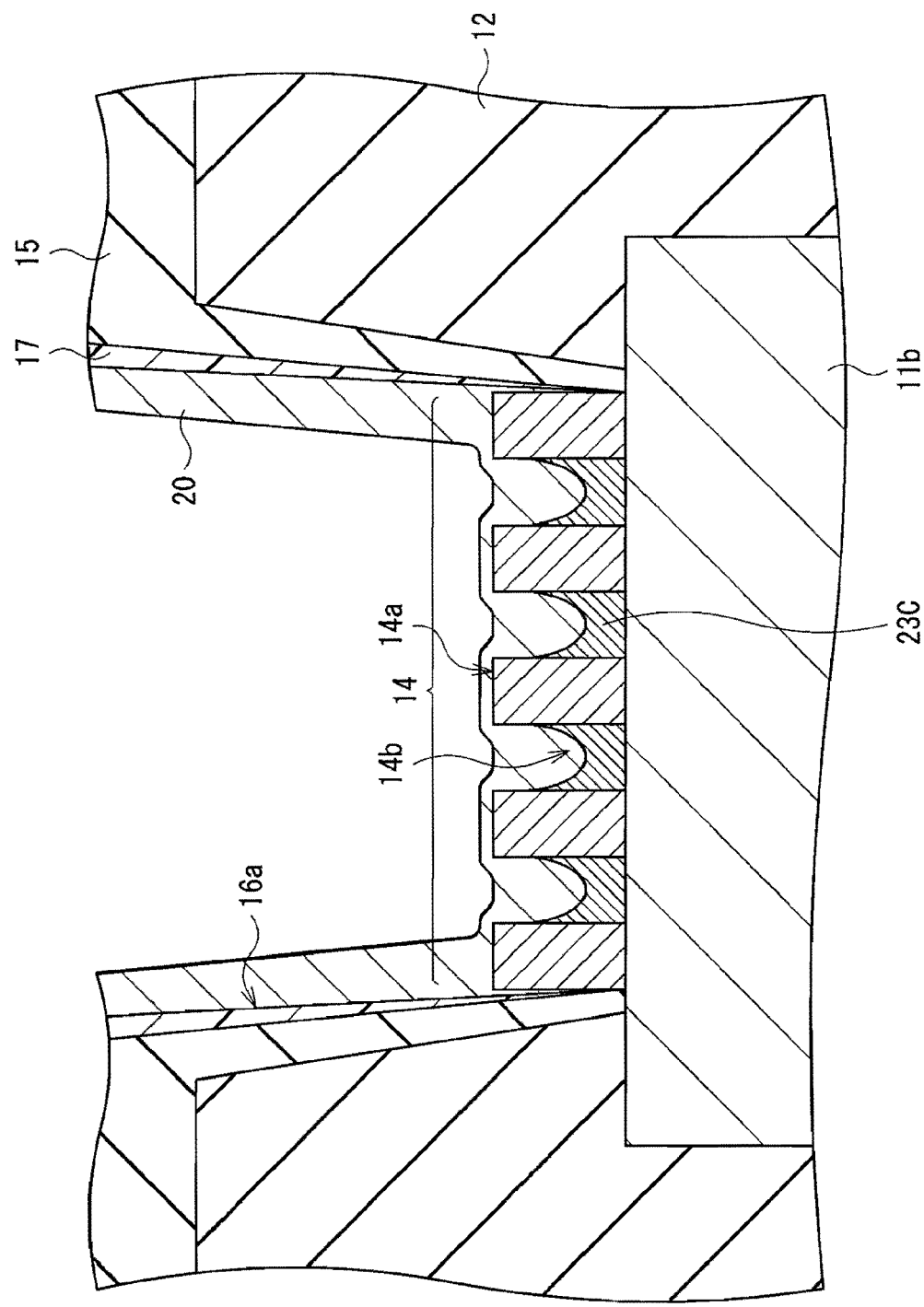
FIG. 12 is an enlarged cross sectional view of a region in which a connection section in a display unit according to a second embodiment of the invention is formed.

FIG. 12 illustrates an enlarged region in which the connection section 14 in a display unit according to a second embodiment of the invention is formed. This embodiment has a structure similar to that of the foregoing first embodiment except for the structure of an organic layer 23c. Thus, the same symbols are affixed to the same elements as those of the first embodiment, and the description thereof will be omitted as appropriate.

The organic layer 23c is formed at the bottom face of the concave section 14b of the connection section 14. The organic layer 23c contains, for example, a conductive fine particle in addition to the component material of the foregoing organic layer 16. The second electrode 20 is formed to cover the organic layer 23c and the convex section 14a. Examples of conductive fine particles include a metal fine particle such as gold, silver, and aluminum, a conductive fine particle such as ITO and ZnO and the like.

Figure 13:
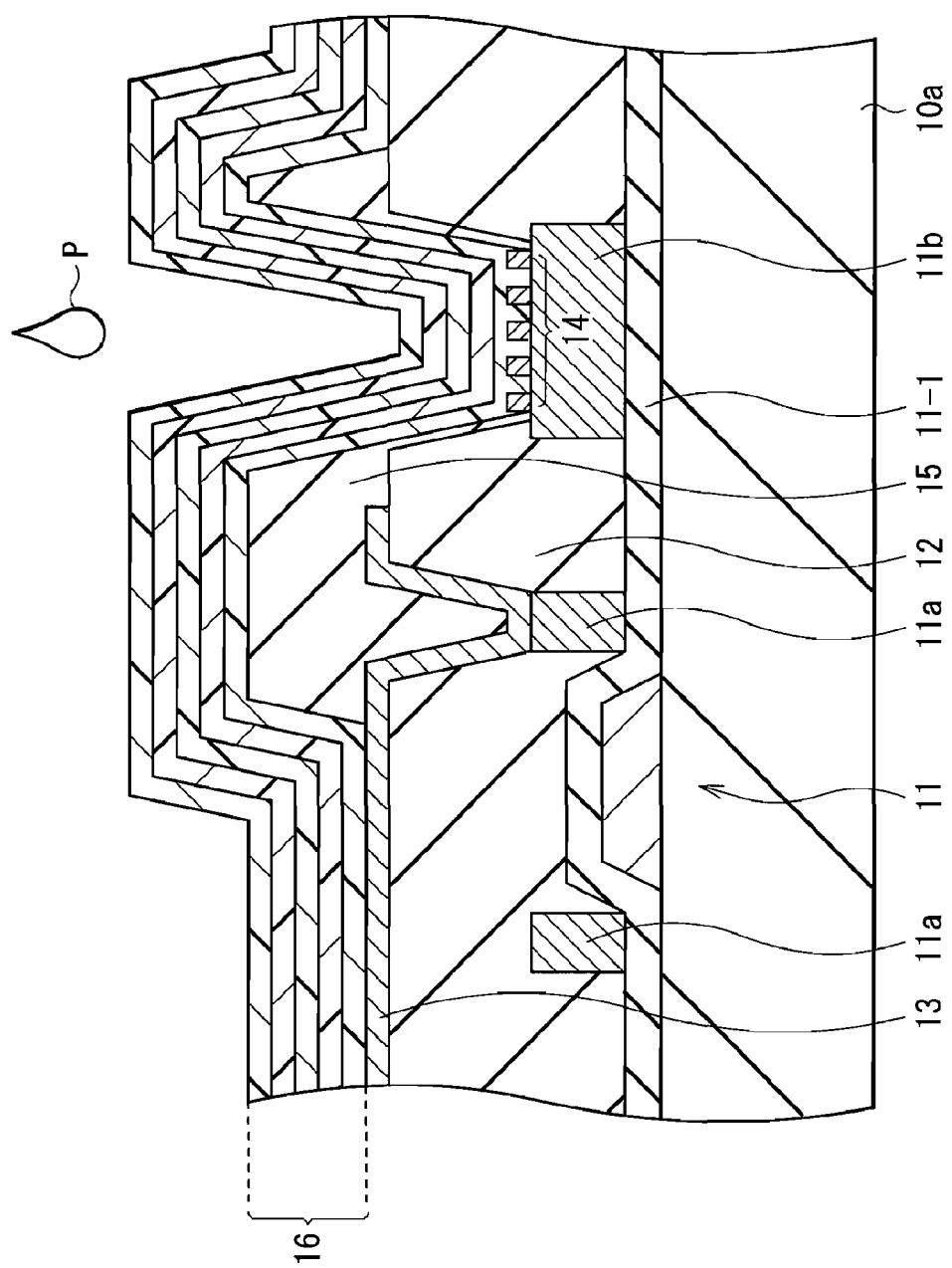
FIG. 13 is a cross sectional view illustrating a method of manufacturing the display unit illustrated in FIG. 12 in order of steps.
Figure 14:
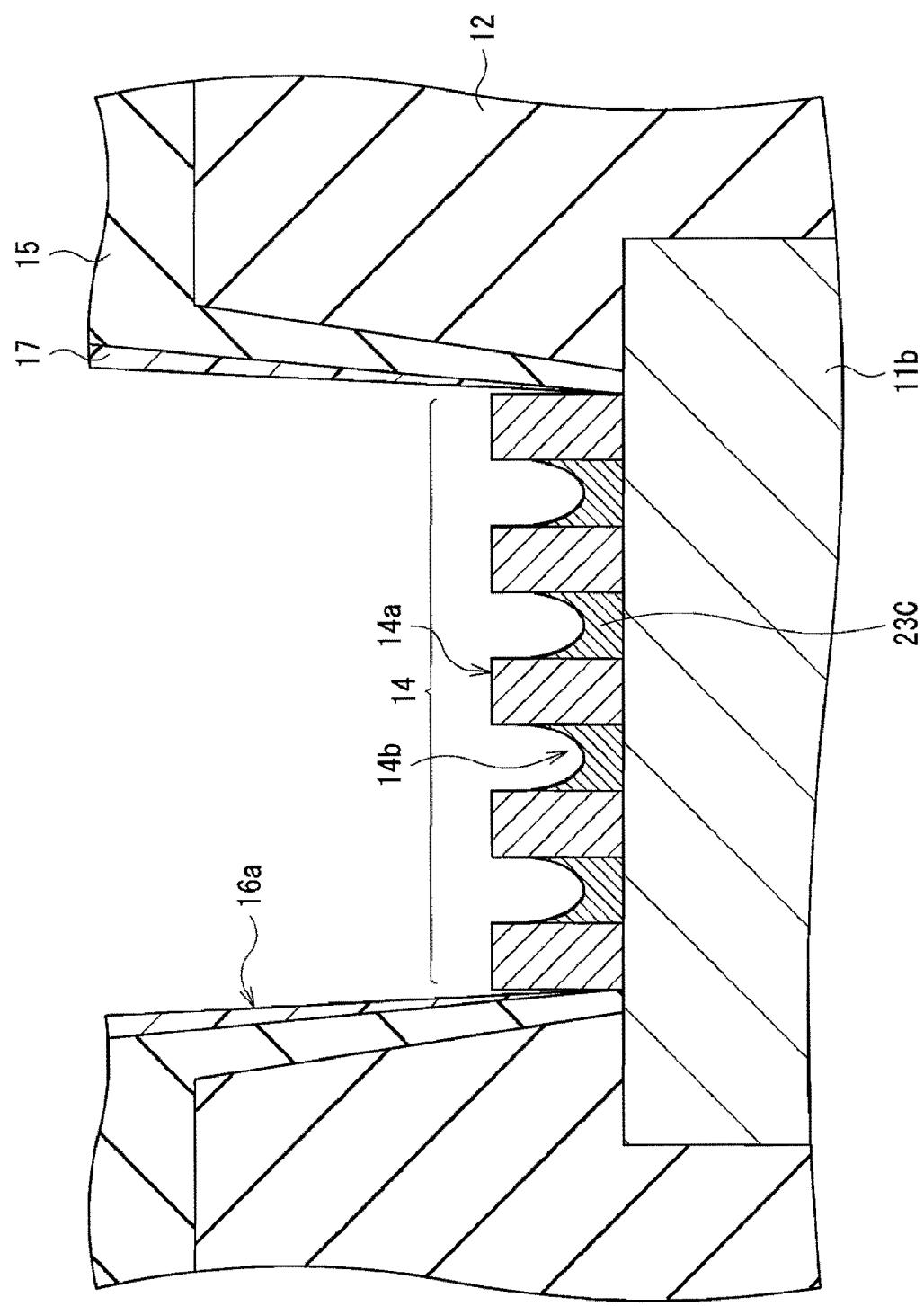
FIG. 14 is a cross sectional view illustrating a step following FIG. 13.

Such an organic layer 23c is able to be formed, for example, as follows. Steps until the organic layer 16 is formed over the whole area of the substrate 10a are similar to those of the foregoing first embodiment. That is, as illustrated in FIG. 13, the region of the organic layer 16 corresponding to the auxiliary wiring layer 11b is coated with a solvent P that contains a conductive fine particle and dissolves the organic layer 16, or the solvent P is dropped onto such a region. At this time, as the solvent to dissolve the organic layer 16, for example, N-methyl-2-pyrrolidone (NMP) or the like is able to be used. Thereby, the aperture 16a is formed in the organic layer 16, and the organic layer 16 dissolved by the solvent P is flown into the concave section 14b of the connection section 14. After that, the substrate 10a is heated to evaporate the solvent P, and thereby the organic layer 23c as a mixed layer of the dissolved component material of the organic layer 16 and the conductive fine particle is formed at the bottom face of the concave section 14b (FIG. 14). Subsequently, in the same manner as that of the foregoing first embodiment, the second electrode 20 is formed and thereby the auxiliary wiring layer 11b and the second electrode 20 are electrically connected. As described above, the aperture 16a is able to be formed in the organic layer 16 not only by the foregoing laser irradiation but also by dissolving the organic layer 16 with the use of the solvent P containing the conductive fine particle. The subsequent steps are similar to those of the foregoing first embodiment.

In this embodiment, effect equal to that of the foregoing first embodiment is able to be obtained. In addition, since the organic layer 23c formed in the concave section 14a of the connection section 14 has electric conductivity, electric contact with the second electrode 20 is able to be obtained not only on the top face and the side face of the convex section 14a but also on the surface of the organic layer 23c. Thus, electric contact area is easily secured more effectively.

The organic layer 23c does not necessarily have electric conductivity. If the organic layer 23c does not have electric conductivity, the aperture 16a may be formed by using only a solvent to dissolve the organic layer. Even if the organic layer 23c does not have electric conductivity, electric connection is sufficiently secured by the convex section 14a of the connection section 14. On the contrary, the convex section 14a of the connection section 14 does not necessarily have electric conductivity if the organic layer 23c has electric conductivity as described above. That is, the material is not limited to the foregoing material, and other insulating material and the like may be used.

THIRD MODIFIED EXAMPLE

Figure 15:
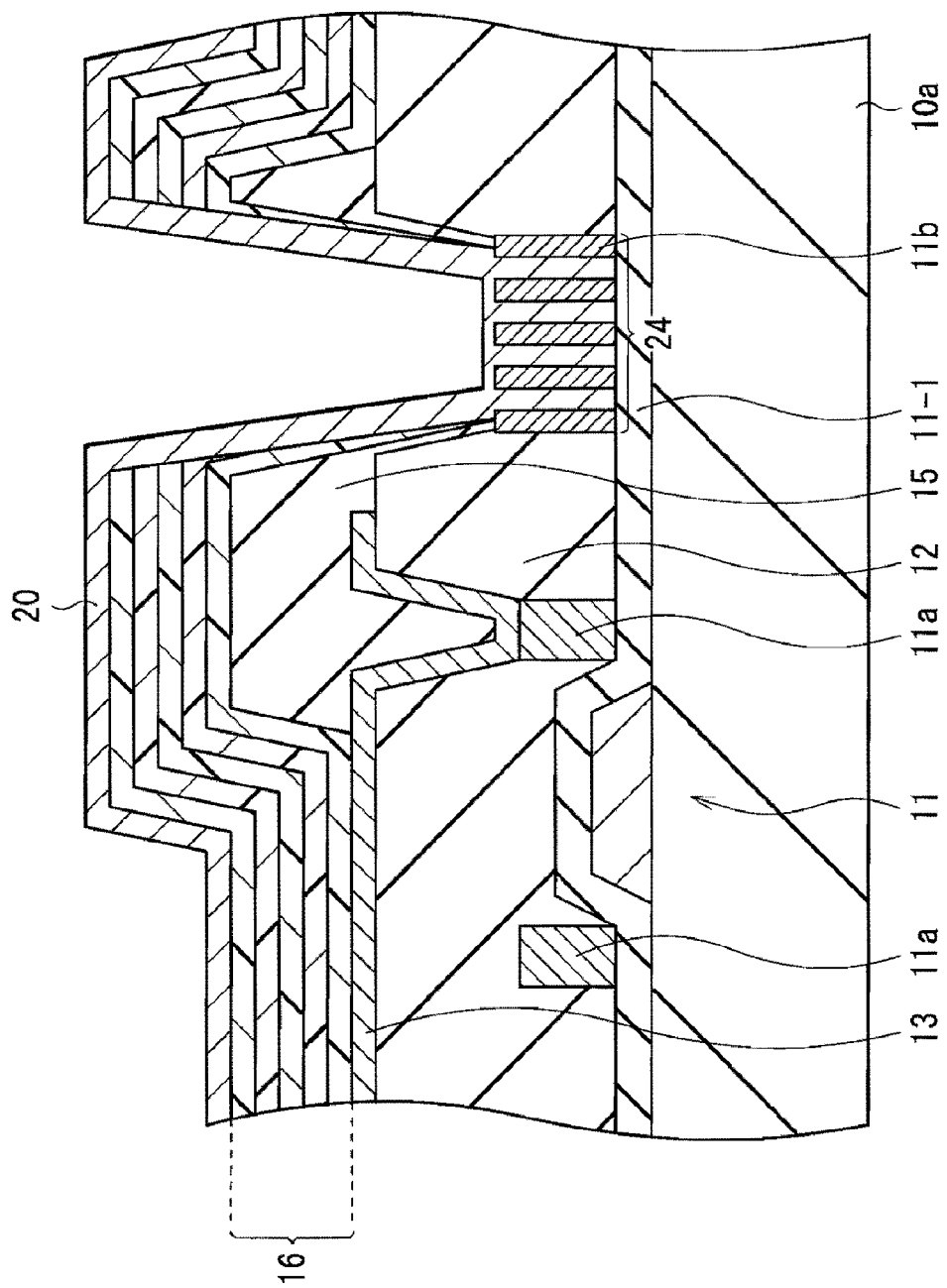
FIG. 15 is an enlarged cross sectional view of an organic light emitting device according to a modified example of the second embodiment of the invention.

FIG. 15 illustrates a cross sectional structure of a region corresponding to one organic light emitting device in a display unit according to a third modified example of the foregoing second embodiment. This modified example has a structure similar to that of the display units of the foregoing first and the second embodiments except for the structure of a connection section 24. Thus, the same symbols are affixed to the elements similar to those of the foregoing first and the second embodiments, and the description thereof will be omitted as appropriate.

In this modified example, the connection section 24 also has a function as the foregoing auxiliary wiring layer 11b. That is, a plurality of convex sections are formed in the auxiliary wiring layer 11b itself. In this case, the connection section 24 is able to be pattern-formed in a step of forming the wiring layer 11a. Thereby, the auxiliary wiring layer and the connection section 24 are able to be formed concurrently, and thus the manufacturing steps are able to be simplified. FIG. 15 illustrates a structure in which the concave section is formed down to the bottom face of the auxiliary wiring layer in the concave and convex pattern formed in the auxiliary wiring layer 11b, but the concave section is not necessarily formed down to the bottom face of the auxiliary wiring layer.

FOURTH MODIFIED EXAMPLE

Figure 16:
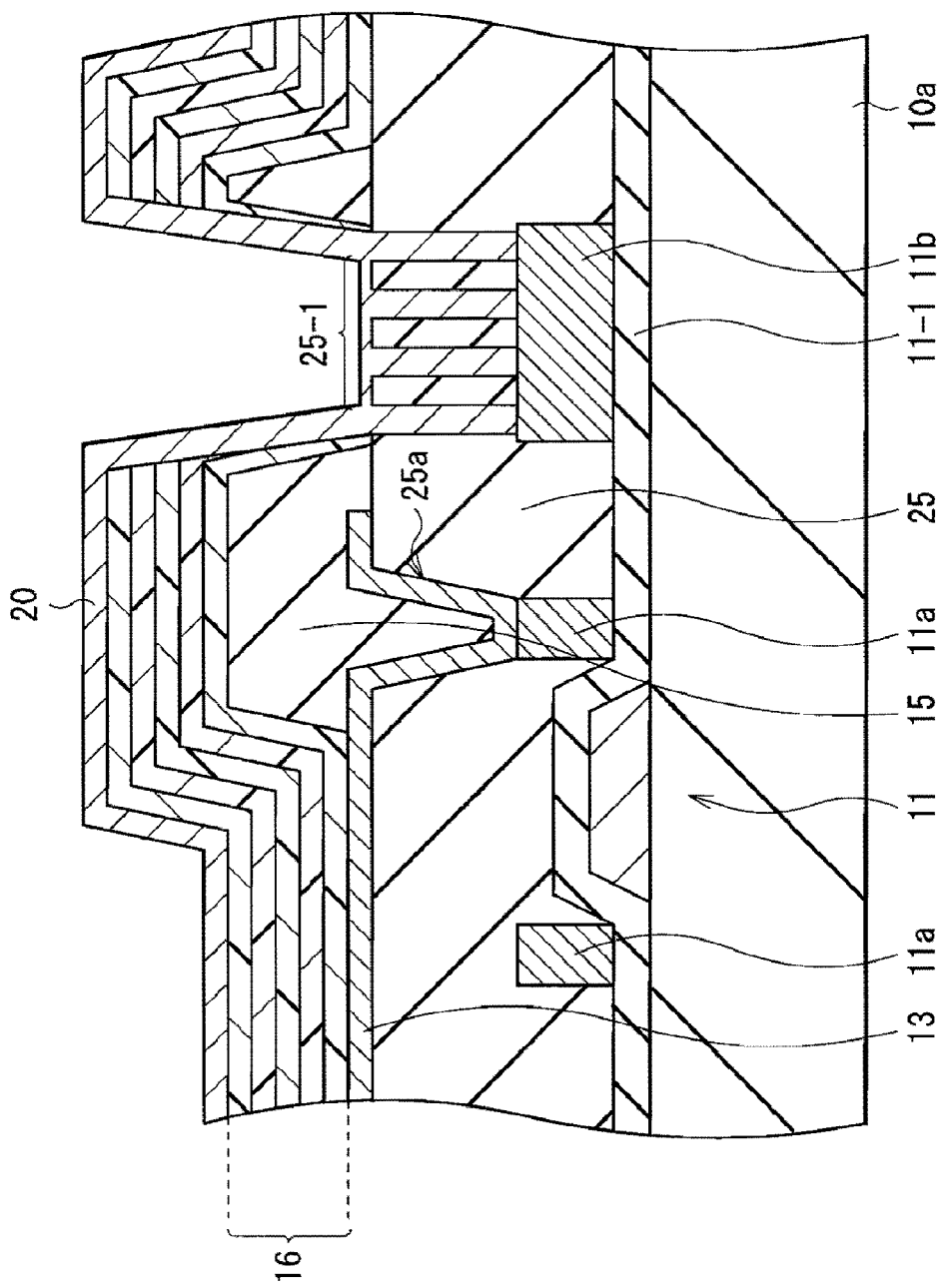
FIG. 16 is an enlarged cross sectional view of an organic light emitting device according to another modified example of the second embodiment of the invention.

FIG. 16 illustrates a cross sectional structure of a region corresponding to one organic light emitting device in a display unit according to a fourth modified example of the foregoing second embodiment. This modified example has a structure similar to that of the display units of the foregoing first and the second embodiments except for the structures of a planarizing layer 25 and a connection section 25a. Thus, the same symbols are affixed to the elements similar to those of the foregoing first and the second embodiments, and the description thereof will be omitted as appropriate.

In this modified example, the planarizing layer 25 is formed to cover the TFT 11, the wiring layer 11a, and the auxiliary wiring layer 11b. In the planarizing layer 25, an aperture 25a is provided in a region corresponding to the wiring layer 11a, and a plurality of convex sections as a connection section 25-1 are formed in a region corresponding to the auxiliary wiring layer 11b. Concave sections in the concave and convex pattern are formed down to the top face of the auxiliary wiring layer 11b. The organic layer 23c (not illustrated in FIG. 16) having electric conductivity as described above is provided in the concave section formed down to the top face of the auxiliary wiring layer 11b. Thereby, electric connection between the auxiliary wiring layer 11b and the second electrode 20 is secured by the organic layer 23c. Thus, effect equal to that of the foregoing second embodiment is able to be obtained.

FIFTH MODIFIED EXAMPLE

Figure 17:
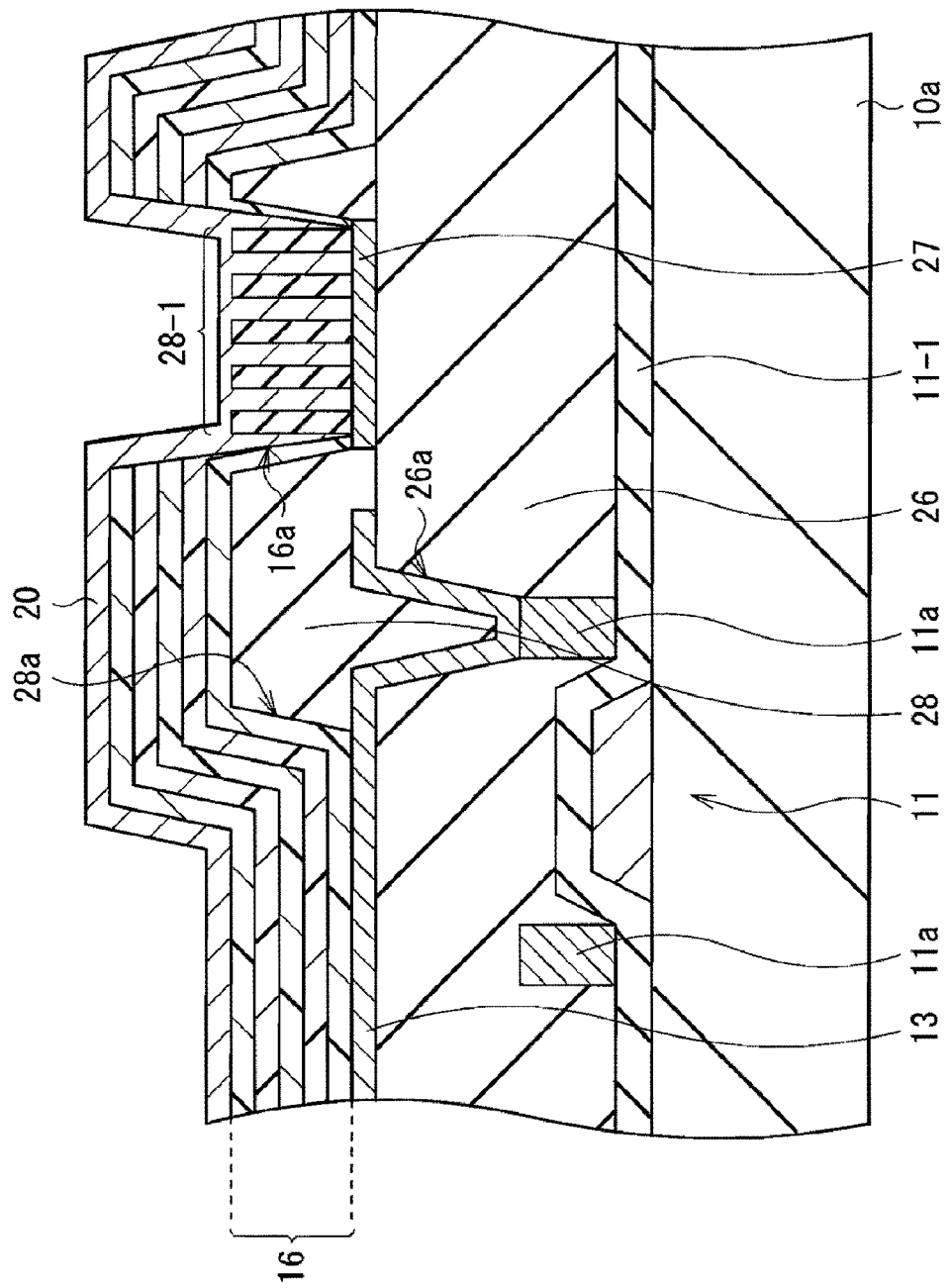
FIG. 17 is an enlarged cross sectional view of an organic light emitting device according to still another modified example of the second embodiment of the invention.

FIG. 17 illustrates a cross sectional structure of a region corresponding to one organic light emitting device in a display unit according to a fifth modified example of the foregoing second embodiment. This modified example has a structure similar to that of the display units of the foregoing first and the second embodiments except for the structures of a planarizing layer 26, an auxiliary wiring layer 27, an insulating film between pixels 28, and a connection section 28-1. Thus, the same symbols are affixed to the elements similar to those of the foregoing first and the second embodiments, and the description thereof will be omitted as appropriate.

In this modified example, the planarizing layer 26 is formed to cover the TFT 11 and the wiring layer 11a. The planarizing layer 26 has an aperture 26a for connecting to the first electrode 13 in a region corresponding to the wiring layer 11a. On the planarizing layer 26, the first electrode 13 is formed to cover the aperture 26a, and the auxiliary wiring layer 27 is provided. On the first electrode 13 and the auxiliary wiring layer 27, the insulating film between pixels 28 for insulating the first electrode 13 from the auxiliary wiring layer 27 is formed. The insulating film between pixels 28 has an aperture 28a in a region corresponding to a light emitting region and a plurality of convex sections as the connection section 28-1 in a region corresponding to the auxiliary wiring layer 27. In the same manner as that of the foregoing fourth modified example, the concave sections in the concave and convex pattern are formed down to the top face of the auxiliary wiring layer 11b. The organic layer 23c (not illustrated in FIG. 17) having electric conductivity as described above is provided in the concave section formed down to the top face of the auxiliary wiring layer 11b. Thereby, electric connection between the wiring layer 11b and the second electrode 20 is secured. Thus, effect equal to that of the foregoing second embodiment is able to be obtained

APPLICATION EXAMPLES AND MODULE

Figure 18:
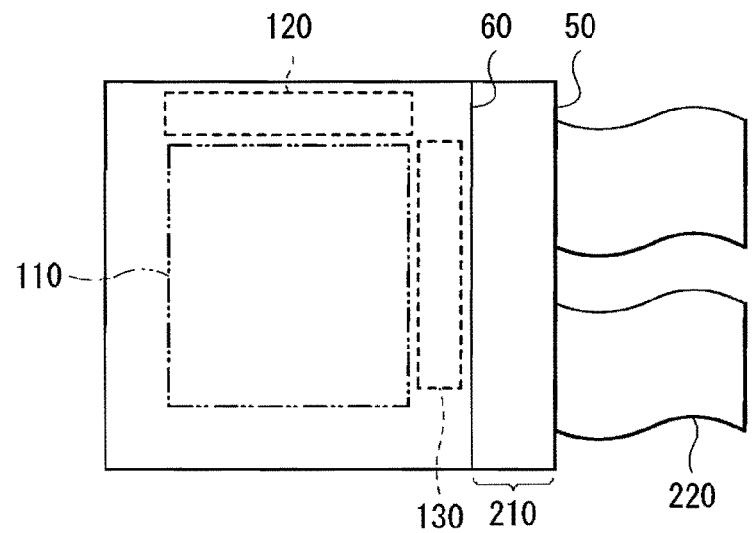
FIG. 18 is a plan view illustrating a schematic structure of a module including the display unit of the embodiments.

A description will be given of a module of the display unit described in the foregoing embodiments and application examples thereof. The display unit is able to be applied to an electronic device in any field for displaying a picture signal inputted from outside or a picture signal generated inside as an image or a picture, such as a television device, a digital still camera, a notebook personal computer, a portable terminal device such as a mobile phone, and a video camera.
Module The display unit is incorporated in various electronic devices such as after-mentioned first to fifth application examples as a module as illustrated in FIG. 18, for example. In the module, a region 210 exposed from a sealing substrate 25 is provided on a side of a driving substrate 50, and an external connection terminal (not illustrated) is formed in the region 210 by extending wirings of a signal line driving circuit 120 and a scanning line driving circuit 130 described later. The external connection terminal may be provided with a Flexible Printed Circuit (FPC) 220 for inputting and outputting a signal.

Figure 19:
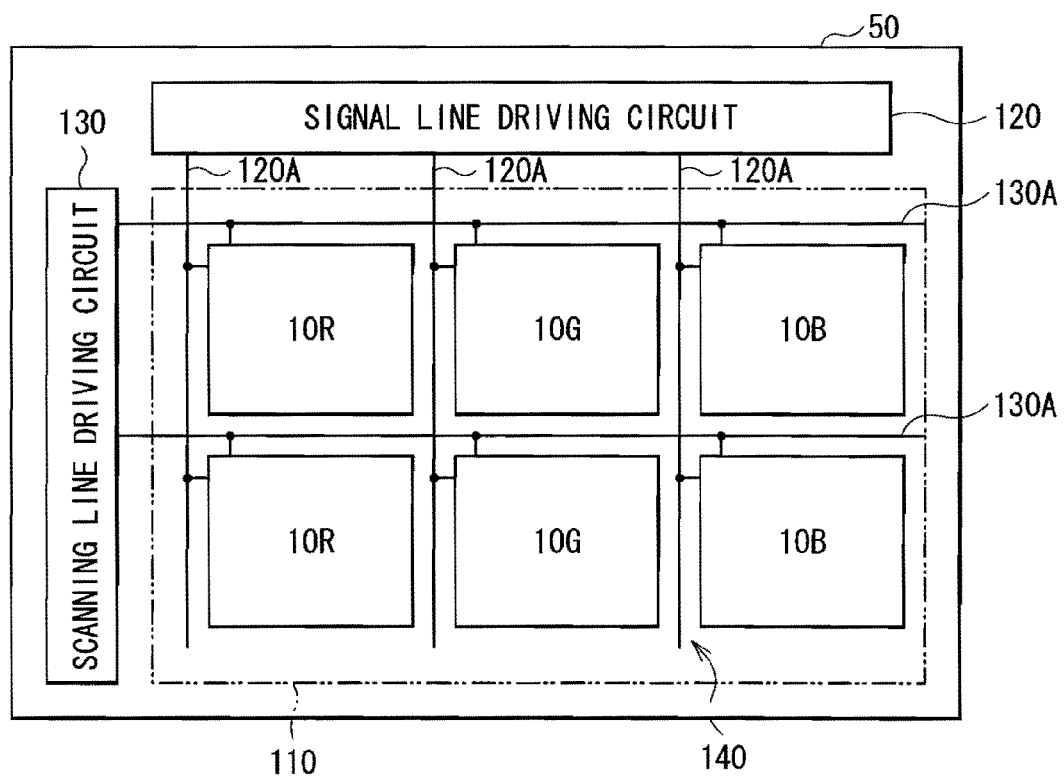
FIG. 19 is a plan view illustrating a structure of a driving circuit of the display unit in the module illustrated in FIG. 18.

For example, as illustrated in FIG. 19, in the driving substrate 50, a display region 110, the signal line driving circuit 120 and the scanning line driving circuit 130 as a driver for displaying a picture are formed. A pixel driving circuit 140 is formed in the display region 110. In the display region 110, the organic light emitting devices 10R, 10G, 10B are arranged in a matrix state as a whole. The organic light emitting devices 10R, 10G, 10B have a reed-like planar shape, and a combination of the organic light emitting devices 10R, 10G, 10B adjacent to each other composes one pixel.

Figure 20:
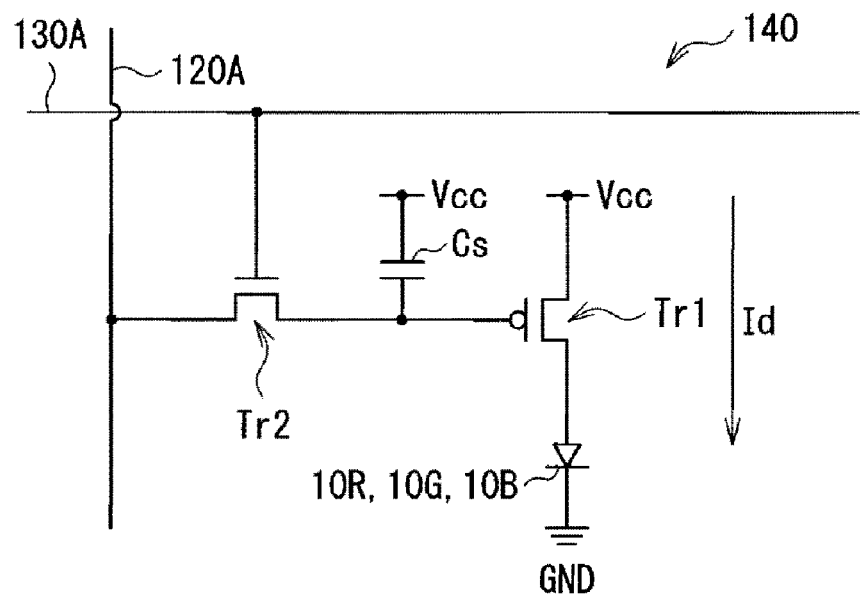
FIG. 20 is an equivalent circuit schematic illustrating an example of the pixel driving circuit illustrated in FIG. 19.

As illustrated in FIG. 20, the pixel driving circuit 140 is formed in a layer lower than a first electrode 51. The pixel driving circuit 140 is an active driving circuit having a driving transistor Tr1, a writing transistor Tr2, a capacitor (retention volume) Cs between the driving transistor Tr1 and the writing transistor Tr2, and the organic light emitting device 10R (or 10G, 10B) serially connected to the driving transistor Tr1 between a first power line (Vcc) and a second power line (GND). The driving transistor Tr1 and the writing transistor Tr2 are composed of a general thin film transistor (TFT (Thin Film Transistor)). The structure thereof is not particularly limited, and may be, for example, inversely staggered structure (so-called bottom gate type) or staggered structure (top gate type).

In the pixel driving circuit 140, a plurality of signal lines 120A are arranged in the column direction, and a plurality of scanning lines 130A are arranged in the row direction. Each cross section between each signal line 120A and each scanning line 130A corresponds to one of the organic light emitting devices 10R, 10G, and 10B (sub pixel). Each signal line 120A is connected to the signal line driving circuit 120. An image signal is supplied to a source electrode of the writing transistor Tr2 from the signal line driving circuit 120 through the signal line 120A. Each scanning line 130A is connected to the scanning line driving circuit 130. A scanning signal is sequentially supplied to a gate electrode of the writing transistor Tr2 from the scanning line driving circuit 130 through the scanning line 130A.

FIRST APPLICATION EXAMPLE

Figure 21:
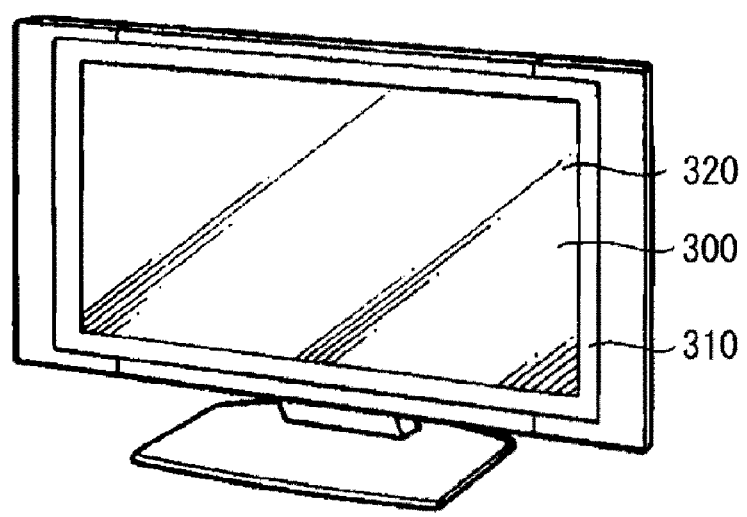
FIG. 21 is a perspective view illustrating an appearance of a first application example of the display unit of the embodiments.

FIG. 21 is an appearance of a television device to which the display unit of the foregoing embodiments is applied. The television device has, for example, a picture display screen section 300 including a front panel 310 and a filter glass 320.

SECOND APPLICATION EXAMPLE

Figure 22A:
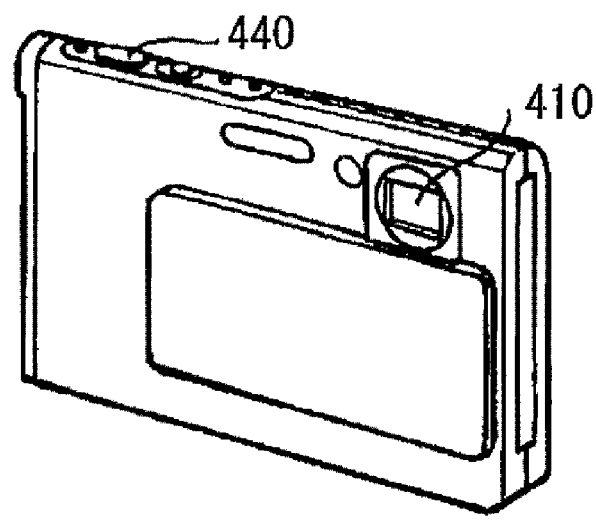
FIGS. 22A and 22B are perspective views illustrating an appearance of a second application example of the display unit of the embodiments.
Figure 22B:
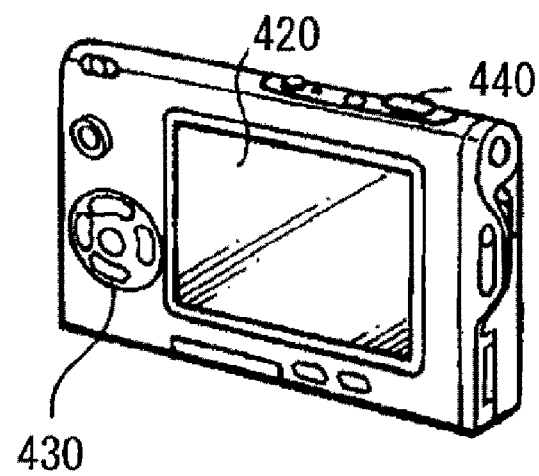

FIGS. 22A and 22B are an appearance of a digital still camera to which the display unit of the foregoing embodiments is applied. The digital still camera has, for example, a light emitting section for a flash 410, a display section 420, a menu switch 430, and a shutter button 440.

THIRD APPLICATION EXAMPLE

Figure 23:
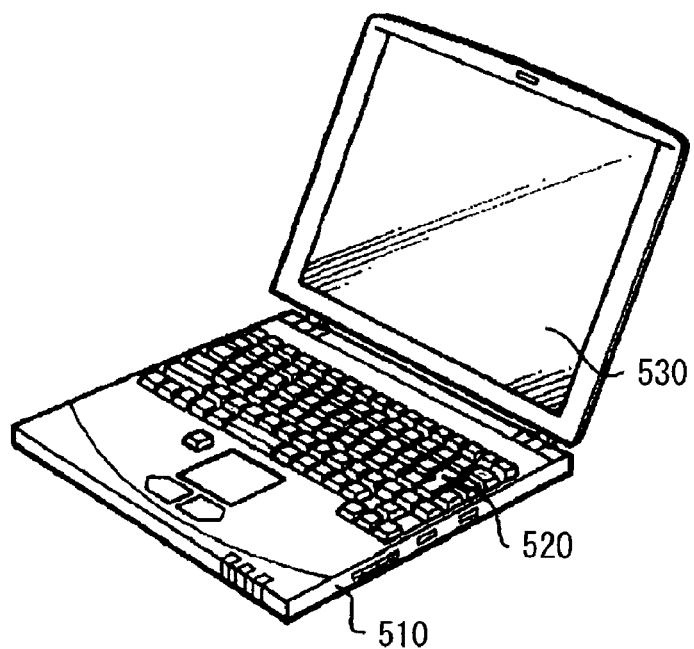
FIG. 23 is a perspective view illustrating an appearance of a third application example of the display unit of the embodiments.

FIG. 23 is an appearance of a notebook personal computer to which the display unit of the foregoing embodiments is applied. The notebook personal computer has, for example, a main body 510, a keyboard 520 for operation of inputting characters and the like, and a display section 530 for displaying an image.

FOURTH APPLICATION EXAMPLE

Figure 24:
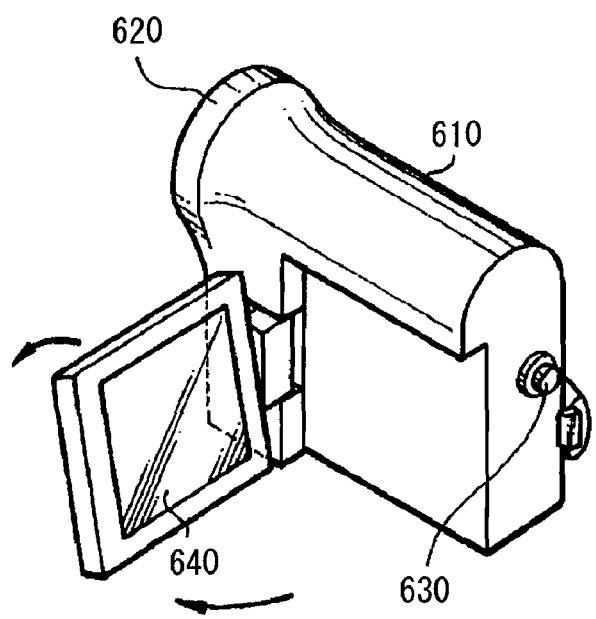
FIG. 24 is a perspective view illustrating an appearance of a fourth application example of the display unit of the embodiments.

FIG. 24 is an appearance of a video camera to which the display unit of the foregoing embodiments is applied. The video camera has, for example, a main body 610, a lens for shooting an object 620 provided on the front side face of the main body 610, a start/stop switch in shooting 630, and a display section 640.

FIFTH APPLICATION EXAMPLE

FIGS. 25A to 25G are an appearance of a mobile phone to which the display unit of the foregoing embodiments is applied. In the mobile phone, for example, an upper package 710 and a lower package 720 are jointed by a joint section (hinge section) 730. The mobile phone has a display 740, a sub-display 750, a picture light 760, and a camera 770.

While the invention has been described with reference to the embodiments, the invention is not limited to the foregoing embodiments, and various modifications may be made. For example, in the foregoing embodiments, a description has been given of the convex section in the connection section 14 taking the convex section having the rectangle cross section as an example. However, the shape of the convex section is not limited thereto, but other shape such as a triangle cross section and a trapezoidal cross section may be applied. Further, the number of the convex sections, the distance between the respective convex sections, the height thereof and the like are not limited to the foregoing structures. Further, in the case where the plurality of convex sections are formed, each convex section does not necessarily have the same shape and the same thickness, and each shape and each thickness may be different.

Further, the material, the thickness, the film-forming method, the film-forming conditions and the like of each layer are not limited to those described in the foregoing embodiments, but other material, other thickness, other film-forming method, and other film-forming conditions may be adopted.

Further, for example, in the foregoing embodiments, a description has been given of the structures of the organic light emitting device and the display unit with specific examples. However, the layers such as the passivation film 30 are not necessarily provided, and other layer may be further provided.

Further, in the foregoing embodiments, a description has been given taking the structure in which white light is generated as a whole as the light emitting layer of the organic layer 16, and three primary color lights are extracted by the color filter as an example. However, color display may be performed by using an optical filter or the like to transmit only light with a specific wavelength instead of such a color filter.

Further, in the foregoing embodiments, a description has been given of a case that the three layers (the red light emitting layer 18R, the green light emitting layer 18G, and the blue light emitting layer 18B) are included as the light emitting layer of the organic layer 16. However, the structure of the light emitting layer for emitting white light is not limited thereto. A structure in which two light emitting layers of two colors complementary to each other such as a combination of an orange light emitting layer and a blue light emitting layer and a combination of a blue-green light emitting layer and a red light emitting layer may be adopted. The light emitting layer of the organic layer 16 is not necessarily intended to emit white light. The invention is able to be applied, for example, to a monochromatic display unit in which only the green light emitting layer 18G is formed.

Further, in the foregoing embodiments, a description has been given of a case that the driving panel 10 and the sealing panel 32 are bonded together with the adhesive layer 31 in between, and thereby the organic light emitting devices 10R, 10G, 10B are sealed. However, the sealing method is not particularly limited. For example, sealing may be made by arranging a sealing can on the rear face of the driving panel 10.

Further, for example, in the foregoing embodiments, a description has been given of a case that the first electrode 13 is used as an anode and the second electrode 20 is used as a cathode. However, on the contrary, it is possible that the first electrode 13 is used as a cathode and the second electrode 20 is used as an anode. In this case, as a material of the second electrode 20, a simple substance or an alloy of gold, silver, platinum, copper and the like are suitable. Further, in the case where the first electrode 13 is used as a cathode and the second electrode 20 is used as an anode, it is preferable that the red light emitting layer 18R, the green light emitting layer 18G, and the blue light emitting layer 18B are layered from the second electrode 20 side in this order.

The present application contains subject matter related to that disclosed in Japanese Priority Patent Application JP 2008-149263 filed in the Japan Patent Office on Jun. 6, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An organic light emitting device comprising:
   a substrate;
   a first electrode over the substrate;
   an auxiliary wiring layer on the substrate and insulated from the first electrode;
   a planarizing layer over the auxiliary wiring;
   a first organic layer on the first electrode, the first organic layer including a light emitting layer;
   an aperture extending through the first organic layer and the planarizing layer in a region corresponding to the auxiliary wiring layer;
   a second electrode covering the first organic layer and the aperture;
   a connection section within the aperture and on the auxiliary wiring layer, the connection section electrically connecting the second electrode to the auxiliary wiring layer and having at least one convex section that extends from the auxiliary wiring layer into the aperture; and
   a second organic layer with a portion adjacent to the convex section of the connection section, said portion of the second organic layer being non-uniformly disposed along a bottom face of a corresponding concavity defined by the convex section,
   wherein,
      the second electrode extends into the aperture and contacts convex section.

2. The organic light emitting device according to claim 1, wherein the convex section includes a top face facing the aperture and side faces and the second electrode covers at least part of the side faces and the top face of the convex section.

3. The organic light emitting device according to claim 1, wherein:
   the connection section has a plurality of such convex sections with concavities therebetween, and
   the second organic layer is in each concavity.

4. The organic light emitting device according to claim 1, wherein the convex section is made of an electrically conductive material.

5. The organic light emitting device according to claim 1, wherein the second organic layer contains a conductive material.

6. The organic light emitting device according to claim 1, wherein the convex section is at least part of the auxiliary wiring layer on the second electrode side.

7. The organic light emitting device according to claim 1, wherein the convex section is made of an insulating material.

8. The organic light emitting device according to claim 7 further comprising on the substrate:
   a drive element; and
   the planarizing layer covering the drive element,
   wherein,
      the convex section is formed from the same material as that of the planarizing layer.

9. The organic light emitting device according to claim 1 further comprising on the substrate:
   a drive element; and
   a wiring layer connecting the drive element to the first electrode,
   wherein,
      the auxiliary wiring layer is made of the same material as that of the wiring layer.

10. The organic light emitting device according to claim 1, wherein the convex section and the first electrode are made of the same material.

11. A display unit comprising:
a substrate; and a plurality of organic light emitting devices over the substrate,
wherein,
(a) each of the organic light emitting devices includes
a first electrode over the substrate,
an auxiliary wiring layer on the substrate and insulated from the first electrode,
a planarizing layer covering the auxiliary wiring layer,
a first organic layer on the first electrode, the first organic layer including a light emitting layer,
an aperture extending through the first organic layer and the planarizing layer in a region corresponding to the auxiliary wiring layer,
a second electrode covering the first organic layer and the aperture,
a connection section within the aperture and on the auxiliary wiring layer, the connection section electrically connecting the second electrode to the auxiliary wiring layer and having at least one convex section that extends from the auxiliary wiring layer into the aperture, and
a second organic layer with a portion adjacent to the convex section of the connection section, said portion of the second organic layer being non-uniformly disposed along a bottom face of a corresponding concavity defined by the convex section, and
(b) the second electrode extends into the aperture and contacts convex section.

12. The display unit according to claim 11 comprising an insulating film over the substrate that electrically separates the plurality of organic light emitting devices from each other, the convex section being formed in the same layer as that of the insulating film, and being formed from the same material as that of the insulating film.

13. An electronic device with a display unit in which a plurality of organic light emitting devices are formed over a substrate, each of the organic light emitting devices comprising:
a first electrode over the substrate;
an auxiliary wiring layer on the substrate and insulated from the first electrode;
a planarizing layer covering the auxiliary wiring layer;
a first organic layer on the first electrode, the first organic layer including a light emitting layer;
an aperture extending through the first organic layer and the planarizing layer in a region corresponding to the auxiliary wiring layer;
a second electrode covering the first organic layer and the aperture;
a connection section on the auxiliary wiring layer and within the aperture, the connection section electrically connecting the second electrode to the auxiliary wiring layer, the connection section having at least one convex section that extends from the auxiliary wiring layer into the aperture; and
a second organic layer with a portion adjacent to the convex section of the connection section, said portion of the second organic layer being non-uniformly disposed along a bottom face of a corresponding concavity defined by the convex section,
wherein,
the second electrode extends into the aperture and contacts convex section.

* * * * *